United States Patent
Chiu et al.

(10) Patent No.: US 11,658,031 B2
(45) Date of Patent: May 23, 2023

(54) IMPLANTATION MASK FORMATION

(71) Applicant: Taiwan Semiconductor Manufacturing Company, Ltd., Hsinchu (TW)

(72) Inventors: Wei-Chao Chiu, Hsinchu (TW);
Yong-Jin Liou, Hsinchu (TW);
Yu-Wen Chen, Hsinchu (TW);
Chun-Wei Chang, Tainan (TW);
Ching-Sen Kuo, Taipei (TW); Feng-Jia Shiu, Jhudong Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/303,522

(22) Filed: Jun. 1, 2021

(65) Prior Publication Data
US 2022/0285155 A1 Sep. 8, 2022

Related U.S. Application Data

(60) Provisional application No. 63/200,388, filed on Mar. 4, 2021.

(51) Int. Cl.
*H01L 21/04* (2006.01)
*H01L 27/146* (2006.01)
(Continued)

(52) U.S. Cl.
CPC ...... *H01L 21/0332* (2013.01); *H01L 21/0465* (2013.01); *H01L 21/266* (2013.01)

(58) Field of Classification Search
CPC ............. H01L 21/0332; H01L 21/0465; H01L 21/266; H01L 27/1464; H01L 27/1463; H01L 27/14689; H01L 27/14643
See application file for complete search history.

(56) References Cited

U.S. PATENT DOCUMENTS 11,158,664 B2   10/2021   Huang et al.
2009/0200587 A1*  8/2009  Venezia ............ H01L 27/14687
                                                         257/292
(Continued)

FOREIGN PATENT DOCUMENTS

TW          202029443 A         8/2020

OTHER PUBLICATIONS

Gustaf Winroth et al., "Precuring implant photoresists for shrink and patterning control", Journal of Micro/Nanolithography, MEMS, and MOEMS 12(4), 041303, Sep. 5, 2013, 6 pages.
(Continued)

*Primary Examiner* — David Vu
(74) *Attorney, Agent, or Firm* — Harrity & Harrity, LLP

(57) ABSTRACT

Implantation mask formation techniques described herein include increasing an initial aspect ratio of a pattern in an implantation mask by non-lithography techniques, which may include forming a resist hardening layer on the implantation mask. The pattern may be formed by photolithography techniques to the initial aspect ratio that reduces or minimizes the likelihood of pattern collapse during formation of the pattern. Then, the resist hardening layer is formed on the implantation mask to increase the height of the pattern and reduce the width of the pattern, which increases the aspect ratio between the height of the openings or trenches and the width of the openings or trenches of the pattern. In this way, the pattern in the implantation mask may be formed to an ultra-high aspect ratio in a manner that reduces or minimizes the likelihood of pattern collapse during formation of the pattern.

20 Claims, 22 Drawing Sheets

(51) Int. Cl.
*H01L 21/033* (2006.01)
*H01L 21/266* (2006.01)

(56) References Cited

U.S. PATENT DOCUMENTS

2013/0008868 A1   1/2013   Uozumi et al.
2019/0244990 A1   8/2019   Hsu et al.

OTHER PUBLICATIONS

David Noga et al., "Understanding pattern collapse in high-resolution lithography: impact of feature width on critical stress", Proc. SPIE 7273, Advances in Resist Materials and Processing Technology XXVI, 727334, Apr. 1, 2009, 9 pages.

\* cited by examiner

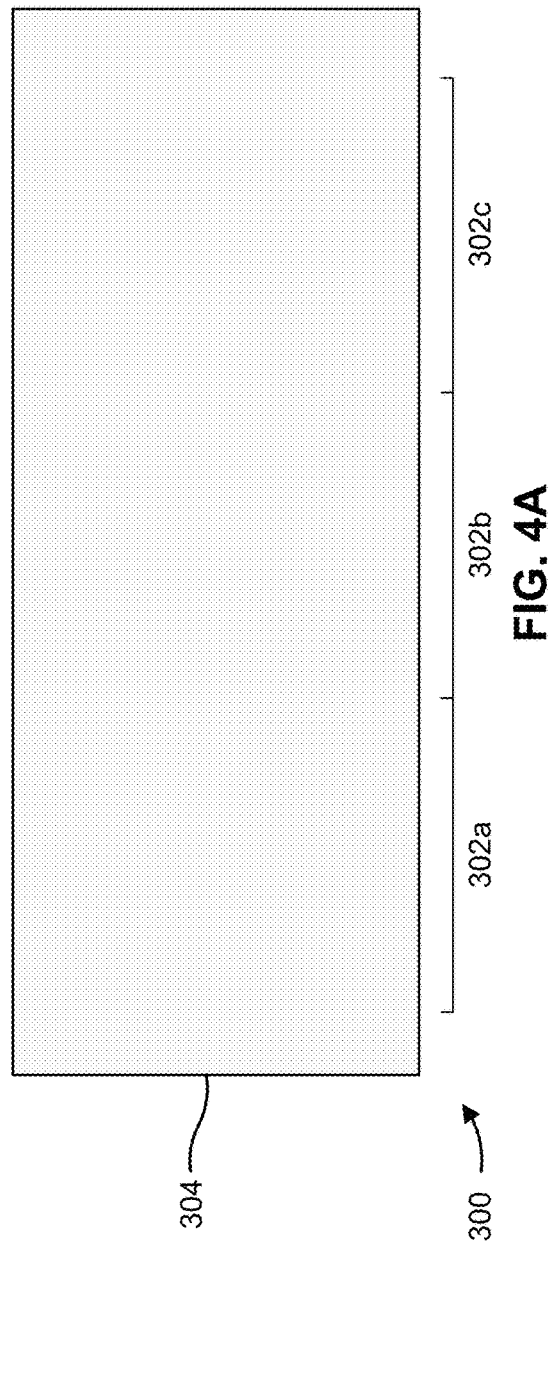

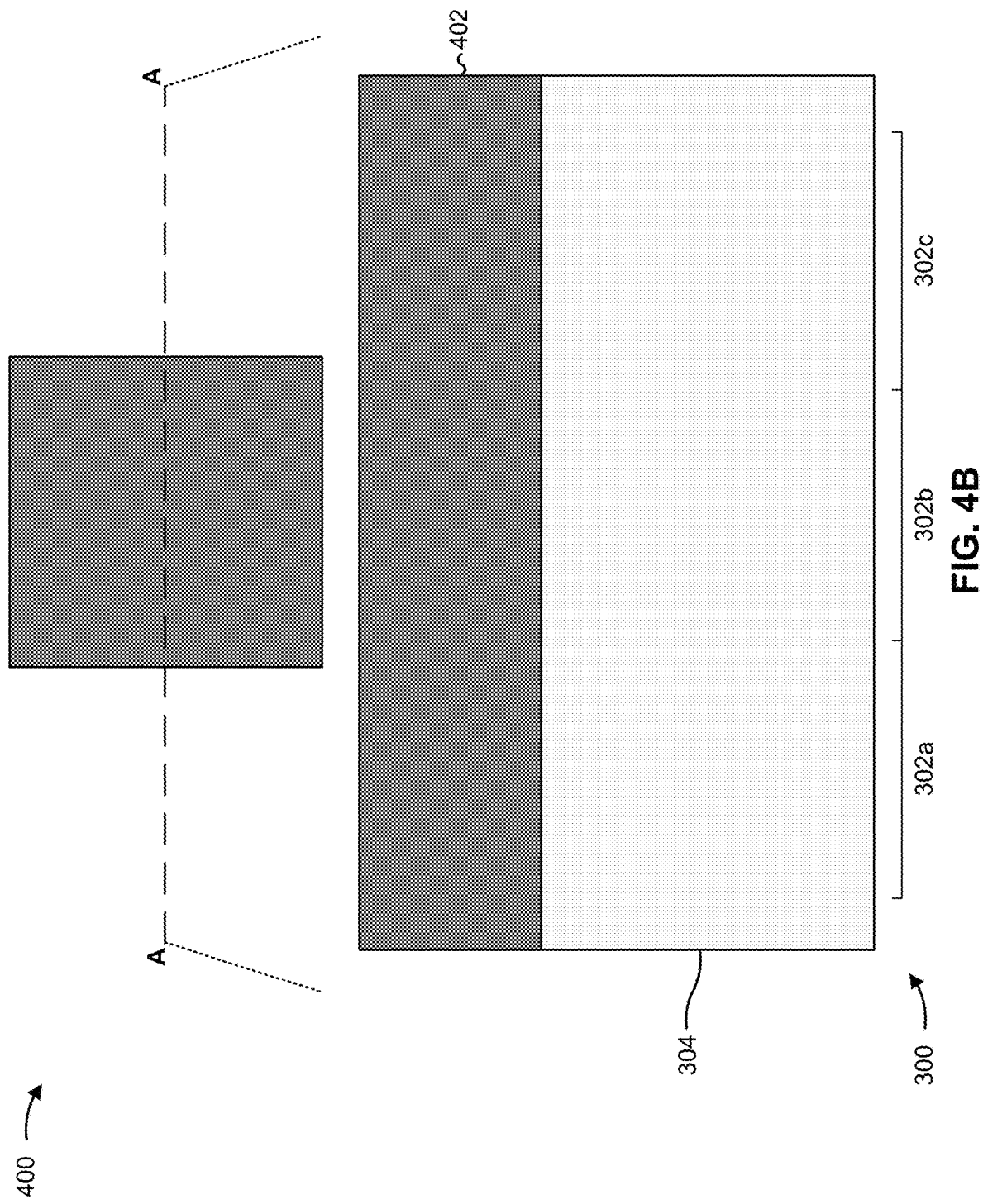

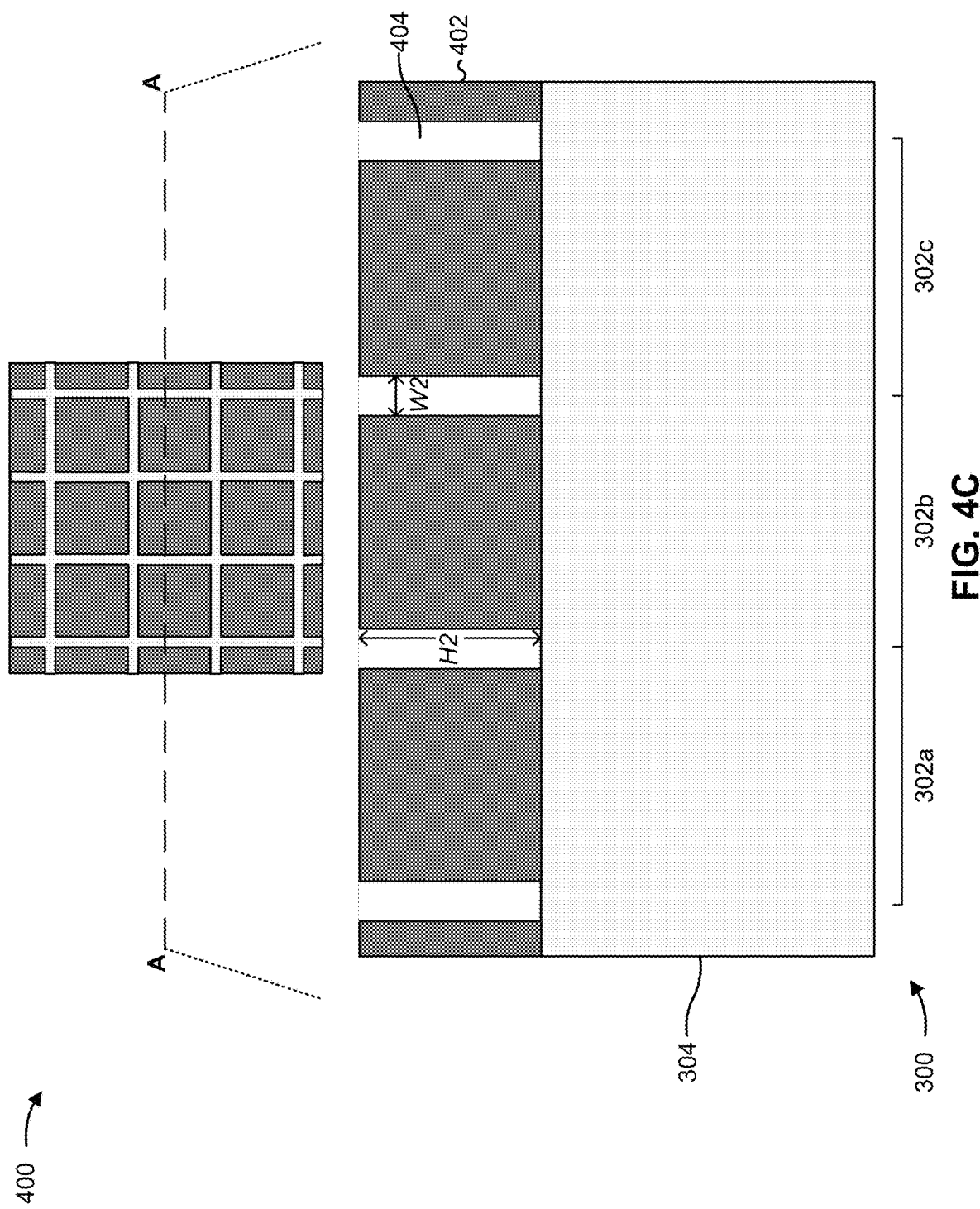

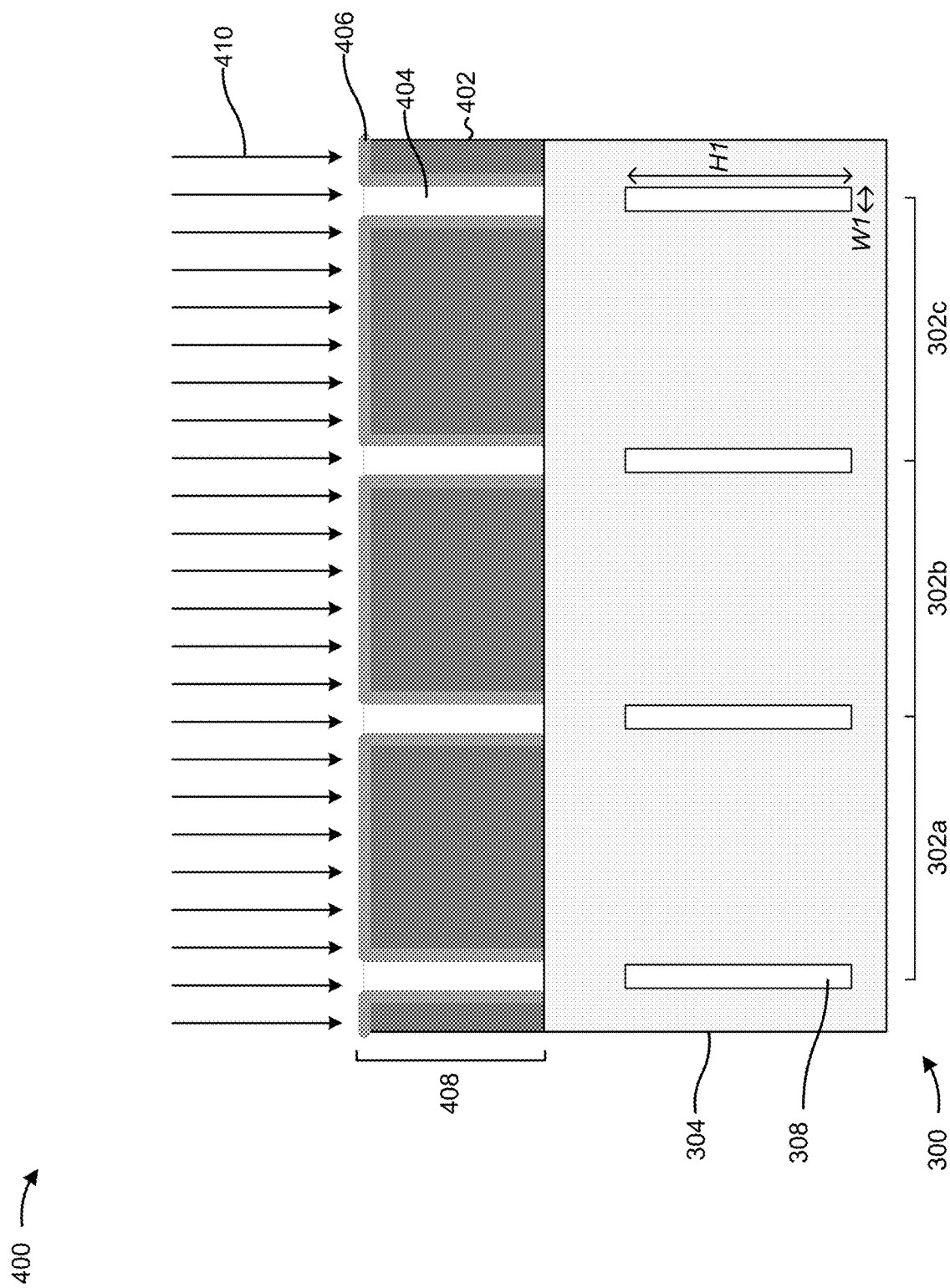

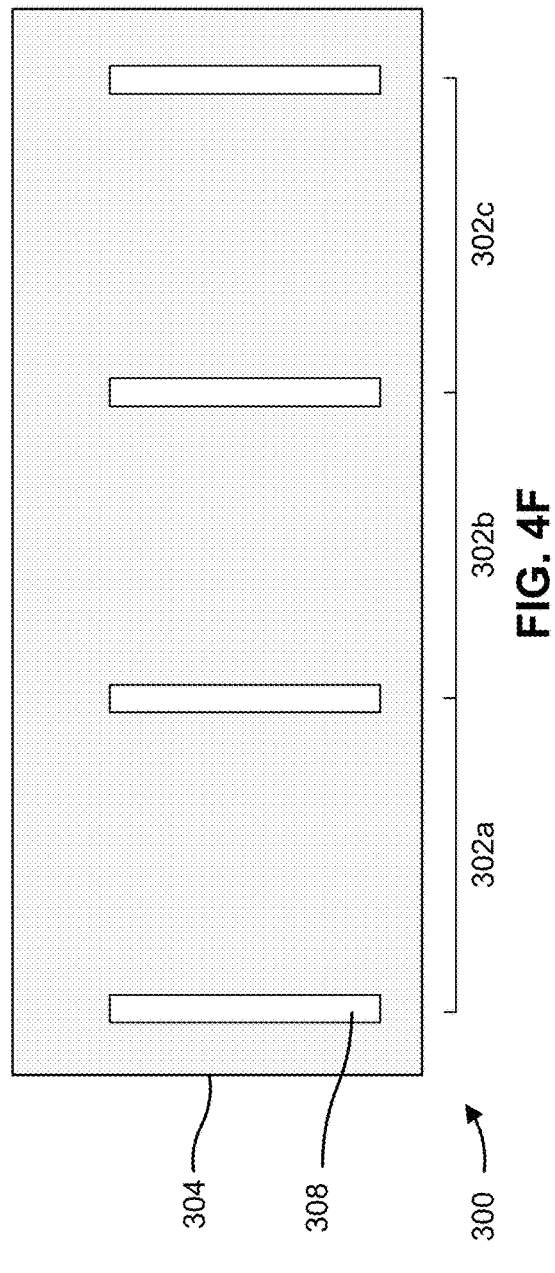

IMPLANTATION MASK FORMATION

CROSS-REFERENCE TO RELATED APPLICATION

This Patent Application claims priority to U.S. Provisional Patent Application No. 63/200,388, filed on Mar. 4, 2021, and entitled "IMPLANTATION MASK FORMATION." The disclosure of the prior Application is considered part of and is incorporated by reference into this Patent Application.

BACKGROUND

Digital cameras and other optical imaging devices employ image sensors. Image sensors convert optical images to digital data that may be represented as digital images. An image sensor includes an array of pixel sensors and supporting logic. The pixel sensors of the array are unit devices for measuring incident light, and the supporting logic facilitates readout of the measurements. One type of image sensor commonly used in optical imaging devices is a backside illumination (BSI) image sensor. BSI image sensor fabrication can be integrated into semiconductor processes for low cost, small size, and high integration. Further, BSI image sensors may have low operating voltage, low power consumption, high quantum efficiency, and low read-out noise, and may allow random access.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
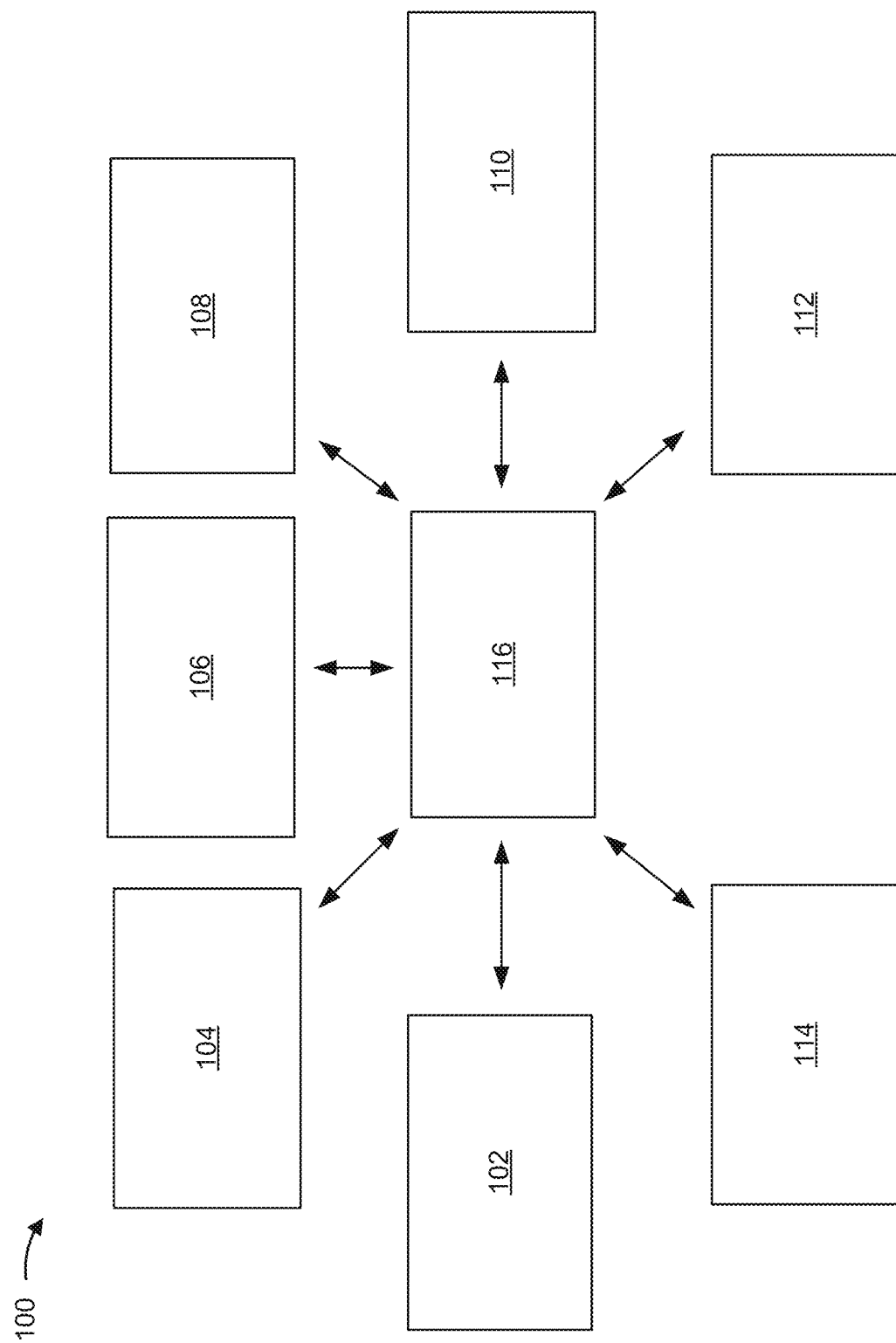
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Isolation wells may be used to provide electrical isolation between the photodiodes of adjacent pixel sensors in a pixel array. Isolation wells may be formed by ion implantation. An implantation mask may be patterned to define the locations in a substrate in which the isolation wells are to be formed. Some issues may occur in connection with the formation of a pattern in an implantation mask. For example, a high-aspect-ratio implantation mask, which may be used to form high-aspect-ratio isolation wells, may suffer from a strong capillary action during rinsing of the implantation mask. Here, the capillary action causes the rinsing agent to be drawn into openings or trenches in the implantation mask. When the implantation mask is dried, the rinsing agent in the openings or trenches in the implantation mask may stress the implantation mask and may cause the pattern in the implantation mask to collapse if the aspect ratio of the implantation mask is high (e.g., if the aspect ratio between the height of the openings or trenches and the width of the openings or trenches is above approximately 8).

Some implementations described herein provide techniques for implantation mask formation to reduce and/or minimize implantation mask collapses and/or other failures during formation of an implantation mask. The techniques described herein may be used to increase the aspect ratios of an implantation mask, which enables the formation of an ultra-high-aspect-ratio implantation mask (e.g., an implantation mask having openings between structures that have an aspect ratio of approximately 10 or greater). The ultra-high-aspect-ratio isolation mask may be used in the formation of ultra-high-aspect-ratio isolation wells having similar aspect ratios, which enables the reduction in size of pixel sensors including the isolation wells to sub-micron sizes (e.g., widths or diameters). This enables size reductions in pixel arrays and complementary metal oxide (CMOS) image sensors including the pixel sensors and enables an increase in density of pixel sensors in the pixel arrays, which further increases the performance of the pixel arrays.

As described herein, an implantation mask may be formed by forming a pattern in a photoresist layer. The pattern may include a plurality of trenches (and/or other types of openings) that have an initial aspect ratio, between a height of the trenches and a width of the trenches, equal to or less than approximately 8. Then, a resist hardening operation is performed to conformally form a resist hardening layer on the pattern and on the sidewalls of the trenches. The resist hardening operation may include performing a surface treatment operation using a perfluorinated compound that is conformally deposited on the pattern and on the sidewalls of the trenches. The perfluorinated compound may locally and partially cross-link with the material of the photoresist layer, thereby forming a hardened carbon-based crust as the resist hardening layer on the photoresist layer.

The formation of the resist hardening layer increases the initial aspect ratio of the trenches in the pattern of the implantation mask from equal to or less than approximately 8 up to a final aspect ratio of approximately 10 or greater. In this way, the implantation mask is initially formed to a relatively lower aspect ratio through photolithography (which reduces the likelihood of collapses and other pattern defects in the implantation mask), and the aspect ratio of the implantation mask is increased through non-lithography techniques. Moreover, the increased hardness of the resist hardening layer (e.g., relative to the hardness of the photoresist layer) may further reduce the likelihood of collapses in the pattern by increasing the ability of the implantation mask to block or resist ion implantation into the photomask layer during an ion implantation operation.

Accordingly, the formation of the resist hardening layer may be used in combination with photolithography techniques to form an ultra-high-aspect-ratio implantation mask instead of forming the ultra-high-aspect-ratio implantation mask exclusively through the use of photolithography techniques. This increases pattern quality (e.g., increases pattern resolution and decreases pattern defects), enables the increase in aspect ratios of isolation wells formed using the ultra-high-aspect-ratio implantation mask, enables an increase in full well capacity (FWC) for the isolation wells, and/or enables deeper implantation of the isolation wells.

FIG. 1 is a diagram of an example environment 100 in which systems and/or methods described herein may be implemented. As shown in FIG. 1, environment 100 may include a plurality of semiconductor processing tools 102-114 and a wafer/die transport tool 116. The plurality of semiconductor processing tools 102-114 may include a deposition tool 102, an exposure tool 104, a developer tool 106, an etch tool 108, a planarization tool 110, a plating tool 112, an ion implantation tool 114, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The ion implantation tool 114 is a semiconductor processing tool that is capable of implanting ions into a substrate. The ion implantation tool 114 may generate ions in an arc chamber from a source material such as a gas or a solid. The source material may be provided into the arc chamber, and an arc voltage is discharged between a cathode and an electrode to produce a plasma containing ions of the source material. One or more extraction electrodes may be used to extract the ions from the plasma in the arc chamber and accelerate the ions to form an ion beam. The ion beam may be directed toward the substrate such that the ions are implanted below the surface of the substrate.

Wafer/die transport tool 116 includes a mobile robot, a robot arm, a tram or rail car, an overhead hoist transport (OHT) system, an automated materially handling system (AMHS), and/or another type of device that is used to transport wafers and/or dies between semiconductor processing tools 102-114 and/or to and from other locations such as a wafer rack, a storage room, and/or the like. In some implementations, wafer/die transport tool 116 may be a programmed device that is configured to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
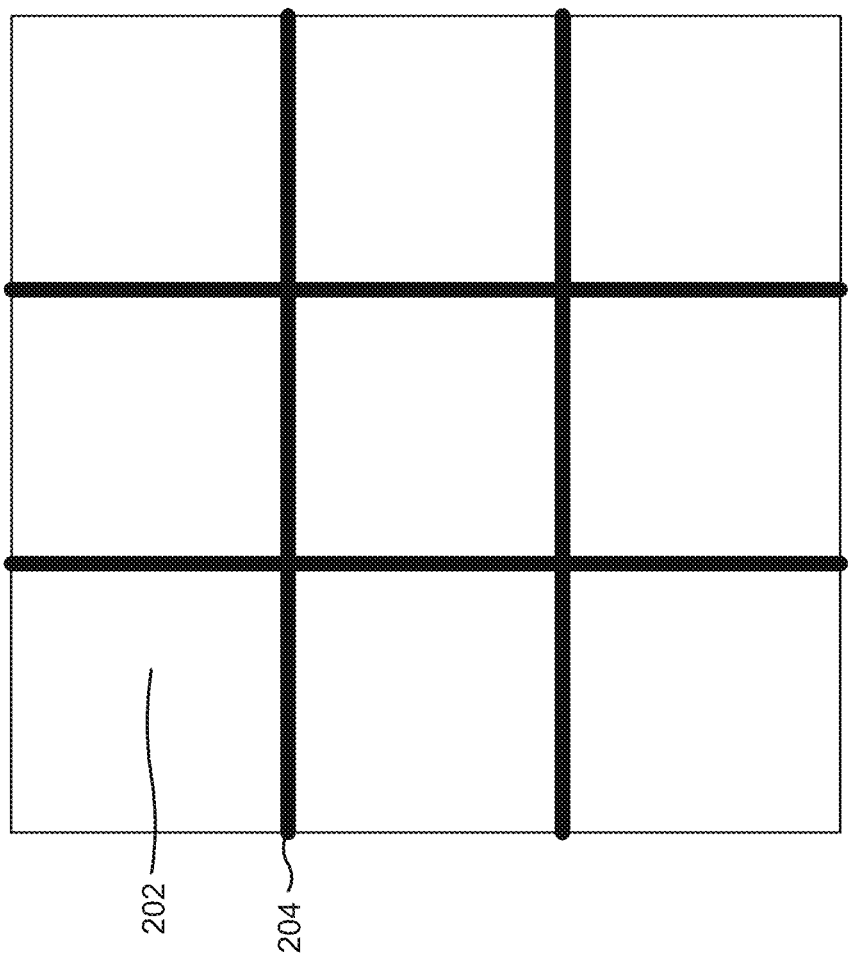
FIGS. 2 and 3 are diagrams of example pixel sensors described herein.

FIG. 2 shows a top-down view of the pixel array 200. In some implementations, the pixel array 200 may be included in an image sensor. The image sensor may include a complementary metal oxide semiconductor (CMOS) image sensor, a backside illuminated (BSI) CMOS image sensor, a front side illuminated (FSI) CMOS image sensor, or another type of image sensor. As shown in FIG. 2, the pixel array 200 may include a plurality of pixel sensors 202. As further shown in FIG. 2, the pixel sensors 202 may be arranged in a grid. In some implementations, the pixel sensors 202 are square-shaped (as shown in the example in FIG. 2). In some implementations, the pixel sensors 202 include other shapes such as circle shapes, octagon shapes, diamond shapes, and/or other shapes.

The pixel sensors 202 may be configured to sense and/or accumulate incident light (e.g., light directed toward the pixel array 200). For example, a pixel sensor 202 may absorb and accumulate photons of the incident light in a photodiode. The accumulation of photons in the photodiode may generate a charge representing the intensity or brightness of the incident light (e.g., a greater amount of charge may correspond to a greater intensity or brightness, and a lower amount of charge may correspond to a lower intensity or brightness).

In some implementations, the size of the pixel sensors 202 (e.g., the width or the diameter) of the pixel sensors 202 is approximately 1 micron. In some implementations, the size of the pixel sensors 202 (e.g., the width or the diameter) of the pixel sensors 202 is less than approximately 1 micron. In these examples, the pixel sensors 202 may be referred to as sub-micron pixel sensors. Sub-micron pixel sensors may decrease the pixel sensor pitch (e.g., the distance between adjacent pixel sensors) in the pixel array 200, which may enable increased pixel sensor density in the pixel array 200 (which can increase the performance of the pixel array 200).

The pixel sensors 202 may be electrically and optically isolated by one or more isolation wells 204 included in the pixel array 200. The isolation wells 204 may include a plurality of interconnected doped regions of a substrate of the pixel array 200. The doped regions may be doped by ion implantation with various types of ions (e.g., p-type ions, n-type ions). The isolation wells 204 may be included around the perimeters of the pixel sensors 202 such that the isolation wells 204 surrounds the pixel sensors 202, as shown in FIG. 2. As indicated above, the pixel array 200 may be included in a BSI CMOS image sensor. In these examples, the isolation wells 204 may be formed from the backside of the pixel array 200.

The pixel array 200 may be electrically connected to a back-end-of-line (BEOL) metallization stack (not shown) of the image sensor. The BEOL metallization stack may electrically connect the pixel array 200 to control circuitry that may be used to measure the accumulation of incident light in the pixel sensors 202 and convert the measurements to an electrical signal.

As indicated above, FIG. 2 is provided as an example. Other examples may differ from what is described with regard to FIG. 2.

Figure 3:
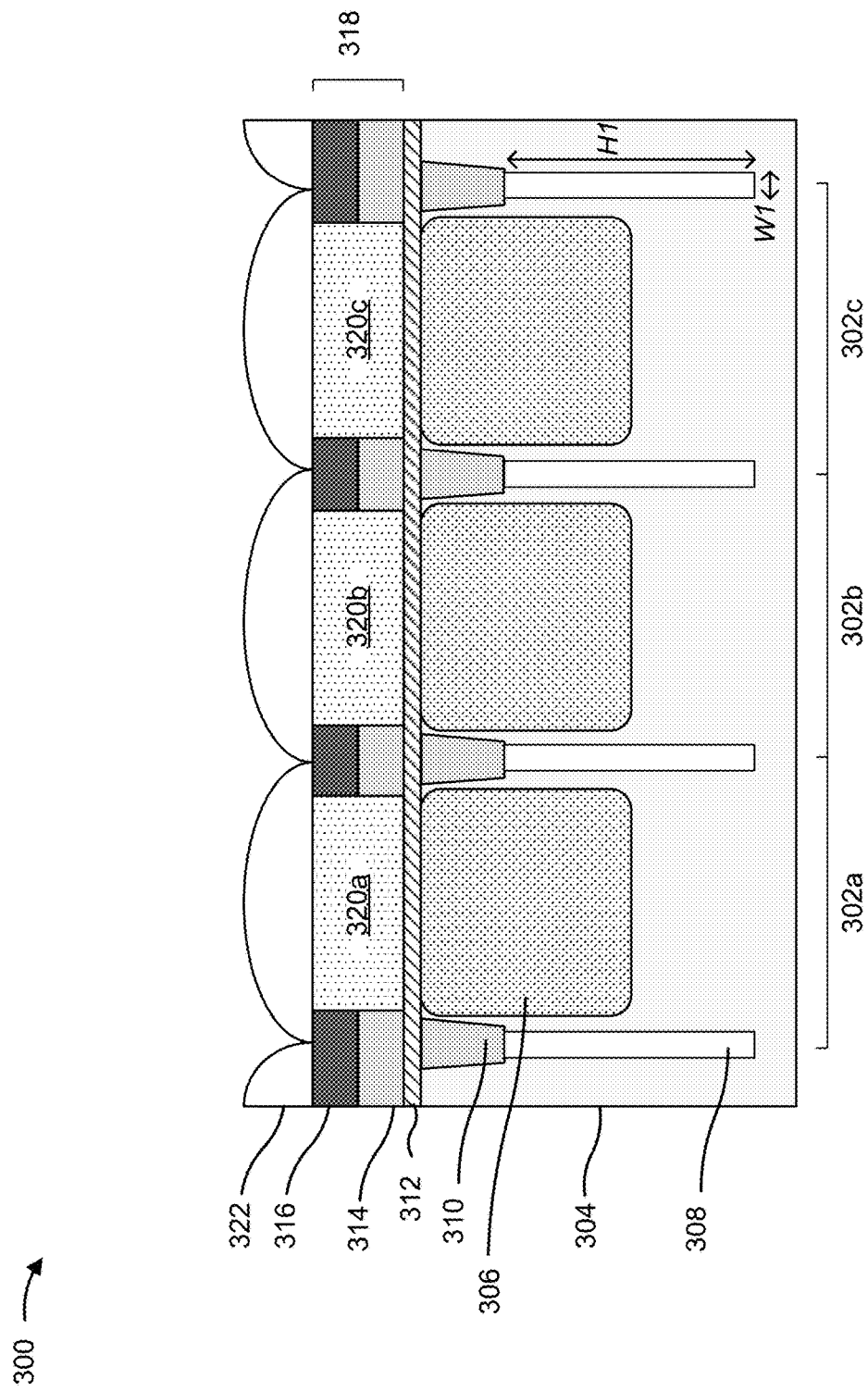

FIG. 3 is a diagram of an example pixel array 300 described herein. In some implementations, the pixel array 300 is configured as and/or implements a pixel sensor 202 and is included in the pixel array 200. In some implementations, the pixel array 300 may be included in an image sensor. The image sensor may be a CMOS image sensor, a BSI CMOS image sensor, or another type of image sensor.

As shown in FIG. 3, the pixel array 300 may include a plurality of adjacent pixel sensors, such as pixel sensors 302a-302c. In some implementations, the pixel sensors 302a-302c are configured as pixel sensors 202 included in the pixel array 200. In some implementations, the pixel sensors 302a-302c include various shapes of pixel sensors, such as square-shaped pixel sensors, octagon-shaped pixel sensors, pixel sensors of another shape, or a combination thereof. The pixel array 300 may include a greater quantity or a lesser quantity of pixel sensors than the quantity illustrates in FIG. 3.

The pixel sensors 302 may be formed in a substrate 304, which may include a semiconductor die substrate, a semiconductor wafer, or another type of substrate in which semiconductor pixel sensors may be formed. In some implementations, the substrate 304 is formed of silicon (Si), a material including silicon, a III-V compound semiconductor material such as gallium arsenide (GaAs), a silicon on insulator (SOI), or another type of semiconductor material that is capable of generating a charge from photons of incident light.

Each pixel sensor 302 may include a photodiode 306. A photodiode 306 may include a region of the substrate 304 that is doped with a plurality of types of ions to form a p-n junction or a PIN junction (e.g., a junction between a p-type portion, an intrinsic (or undoped) type portion, and an n-type portion). For example, the substrate 304 may be doped with an n-type dopant to form a first portion (e.g., an n-type portion) of a photodiode 306 and a p-type dopant to form a second portion (e.g., a p-type portion) of the photodiode 306. A photodiode 306 may be configured to absorb photons of incident light. The absorption of photons causes a photodiode 306 to accumulate a charge (referred to as a photocurrent) due to the photoelectric effect. Here, photons bombard the photodiode 306, which causes emission of electrons of the photodiode 306. The emission of electrons causes the formation of electron-hole pairs, where the electrons migrate toward the cathode of the photodiode 306 and the holes migrate toward the anode, which produces the photocurrent.

The pixel array 300 may include a plurality of regions to provide electrical isolation and/or optical isolation between the pixel sensors 302. The pixel array 300 may include a plurality of isolation wells 308 in the substrate 304. The isolation wells 308 may include a cell p-well region (CPW), a deep p-well region (DPW), and/or another type of doped region. The isolation wells 308 may surround the photodiodes 306 of the pixel sensors 302. Each isolation well 308 may include a $p^+$ doped silicon material or another $p^+$ doped material, an $n^+$ doped silicon material or another $n^-$ doped material, and/or another type of doped material.

The isolation wells 308 (or a subset thereof) may be formed by one or more ion implantation operations using an implantation mask that is formed by one or more implantation mask formation techniques described herein. The implantation mask formation techniques may enable the isolation wells 308 to be formed to a high aspect ratio (or an ultra-high aspect ratio) between a height (H1) of the isolation wells 308 and a width (W1) of the of the isolation wells 308. As an example, the implantation mask formation techniques may enable the isolation wells 308 to be formed to an aspect ratio of approximately 10 or greater to achieve a greater isolation well height (H1) and/or a smaller isolation well width (W1), which may provide increased full well capacity (FWC) and/or increased isolation performance for the isolation wells 308. An example range of the height (H1) of the isolation wells 308 include approximately 1800 nanometers to approximately 2100 nanometers to provide sufficient optical isolation and to reduce damage to the substrate 304. An example, range of the width (W1) of the isolation wells 308 includes approximately 180 nanometers to approximately 210 nanometers to provide sufficient optical and/or electrical isolation and to reduce damage to the substrate 304. However, other values for the height (H1), the width (W1), and/or the aspect ratio are within the scope of the present disclosure.

An isolation structure 310 (e.g., a deep trench isolation (DTI) structure, a shallow trench isolation (STI) structure) may be included in the substrate 304 over the isolation wells 308. The isolation structure 310 may include one or more trenches that extend downward into the substrate 304 and surround the photodiodes 306 similar to the isolation wells 308. The isolation structure 310 may provide optical isolation between a pixel sensor 302 and one or more adjacent pixel sensors 302 to reduce the amount of optical crosstalk between the pixel sensor 302 and the one or more adjacent pixel sensors 302. In particular, the isolation structure 310 may absorb, refract, and/or reflect incident light, which may reduce the amount of incident light that travels through a pixel sensor 302 into an adjacent pixel sensor 302 and is absorbed by the adjacent pixel sensor 302. The isolation structure 310 may include one or more dielectric materials, such as a silicon oxide ($SiO_x$) (e.g., silicon dioxide ($SiO_2$)), a hafnium oxide ($HfO_x$), a hafnium silicon oxide ($HfSiO_x$), an aluminum oxide ($Al_xO_y$), and/or another type of oxide material.

An antireflective coating (ARC) 312 may be included over and/or on the substrate 304, over and/or on the isolation structure 310, and/or over and/or on the photodiodes 306. The ARC 312 may include a suitable material for reducing a reflection of incident light projected toward the photodiode 306. For example, the ARC 312 may include a nitrogen-containing material and/or another type of material.

A dielectric layer 314 may be included over and/or on the ARC 312. The dielectric layer 314 may include an organic material, an oxide, a nitride, and/or another type of dielectric material such as a silicon oxide ($SiO_x$) (e.g., silicon dioxide ($SiO_2$)), a hafnium oxide ($HfO_x$), a hafnium silicon oxide ($HfSiO_x$), an aluminum oxide ($Al_xO_y$), a silicon nitride ($Si_xN_y$), a zirconium oxide ($ZrO_x$), a magnesium oxide ($MgO_x$), a yttrium oxide ($Y_xO_y$), a tantalum oxide ($Ta_xO_y$), a titanium oxide ($TiO_x$), a lanthanum oxide ($La_xO_y$), a barium oxide ($BaO_x$), a silicon carbide (SiC), a lanthanum aluminum oxide ($LaAlO_x$), a strontium oxide (SrO), a zirconium silicon oxide ($ZrSiO_x$), and/or a calcium oxide (CaO), among other examples.

A metal layer 316 may be included over and/or on the dielectric layer 314. The metal layer 316 may include a metallic material such as tungsten (W), copper (Cu), aluminum (Al), cobalt (Co), nickel (Ni), titanium (Ti), tantalum (Ta), another type of conductive material, and/or an alloy including one or more of the foregoing. The metal layer 316 may be configured to reflect a portion of incident light to reduce optical crosstalk.

A grid structure 318 may be included over and/or on the ARC 312, over the isolation structure 310, and/or over the substrate 304. The grid structure 318 may include a plurality of interconnected columns formed from one or more layers that are etched to form the columns. The grid structure 318 may be included above the pixel sensors 302 and may surround the perimeters of the pixel sensors 302. The grid structure 318 may be configured to provide optical isolation and additional crosstalk reduction in combination with the isolation structure 310 and the isolation wells 308.

In some implementations, the grid structure 318 includes the dielectric layer 314 and the metal layer 316, and may be referred to as a metal grid or a composite metal grid (CMG). The metal layer 316 may be configured to reflect and/or absorb incident light to reduce optical crosstalk between adjacent pixel sensors 302. In some implementations, the metal layer 316 is omitted from the grid structure 318, and the grid structure 318 may be referred to as an oxide grid, a dielectric grid, or a color filter in a box (CIAB) grid, among other examples.

Respective color filter regions 320 may be included in the areas surrounded by the grid structure 318. For example, a color filter region 320a may be formed in between columns of the grid structure 318 over the photodiode 306 of the pixel sensor 302a, a color filter region 320b may be formed in between columns of the grid structure 318 over the photodiode 306 of the pixel sensor 302b, a color filter region 320c may be formed in between columns of the grid structure 318 over the photodiode 306 of the pixel sensor 302c, and so on. A refractive index of the color filter regions 320 may be greater relative to a refractive index of the grid structure 318 to increase a likelihood of a total internal reflection in the color filter regions 320 at an interface between the sidewalls of the color filter regions 320 and the sidewalls of the grid structure 318, which may increase the quantum efficiency of the pixel sensors 302.

Each color filter region 320 may be configured to filter incident light to allow a particular wavelength of the incident light to pass to a photodiode 306 of an associated pixel sensor 302. For example, the color filter region 320a included in the pixel sensor 302a may filter red light for the pixel sensor 302a (and thus, the pixel sensor 302a may be a red pixel sensor), the color filter region 320b included in the pixel sensor 302b may filter green light for the pixel sensor 302b (and thus, the pixel sensor 302b may be a green pixel sensor), the color filter region 320c included in the pixel sensor 302c may filter blue light for the pixel sensor 302c (and thus, the pixel sensor 302c may be a blue pixel sensor), and so on.

A blue filter region may permit the component of incident light near a 450 nanometer wavelength to pass through a color filter region 320 and block other wavelengths from passing. A green filter region may permit the component of incident light near a 550 nanometer wavelength to pass through a color filter region 320 and block other wavelengths from passing. A red filter region may permit the component of incident light near a 650 nanometer wavelength to pass through a color filter region 320 and block other wavelengths from passing. A yellow filter region may permit the component of incident light near a 580 nanometer wavelength to pass through a color filter region 320 and block other wavelengths from passing.

In some implementations, a color filter region 320 may be non-discriminating or non-filtering, which may form a white pixel sensor. A non-discriminating or non-filtering color filter region 320 may include a material that permits all wavelengths of light to pass into the associated photodiode 306 (e.g., for purposes of determining overall brightness to increase light sensitivity for the image sensor). In some implementations, a color filter region 320 may be an NIR bandpass color filter region, which may define a near infrared (NIR) pixel sensor. An NIR bandpass color filter region 320 may include a material that permits the portion of incident light in an NIR wavelength range to pass to an associated photodiode 306 while blocking visible light from passing.

A micro-lens layer 322 may be included above and/or on the color filter regions 320. The micro-lens layer 322 may include a respective micro-lens for each of the pixel sensors 302. For example, a micro-lens may be formed to focus incident light toward the photodiode 306 of the pixel sensor 302a, another micro-lens may be formed to focus incident light toward the photodiode 306 of the pixel sensor 302b, another micro-lens may be formed to focus incident light toward the photodiode 306 of the pixel sensor 302c, and so on.

As indicated above, FIG. 3 is provided as an example. Other examples may differ from what is described with regard to FIG. 3.

Figure 4D:
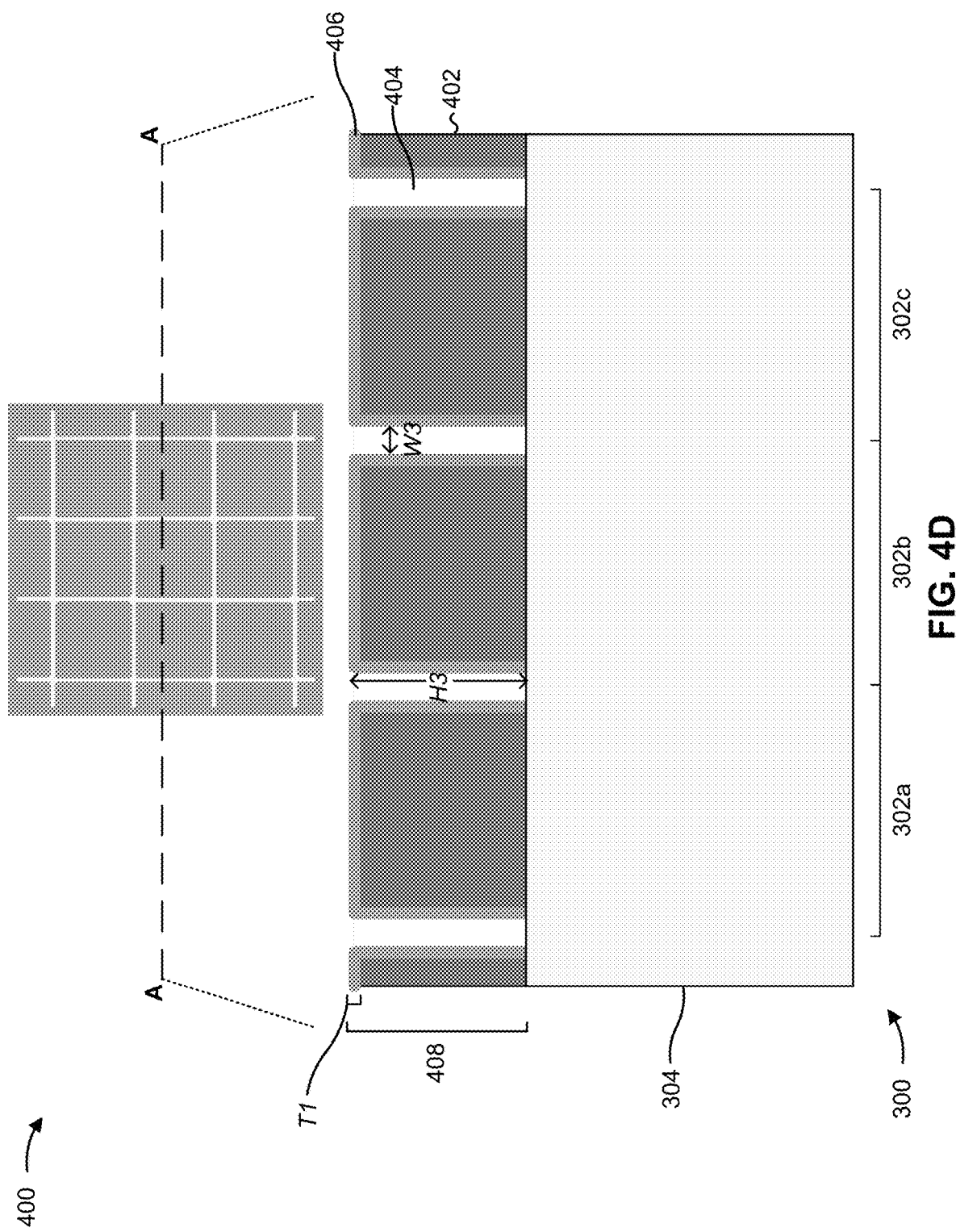
FIG. 4A-4O are diagrams of an example implementation described herein.
Figure 4G:
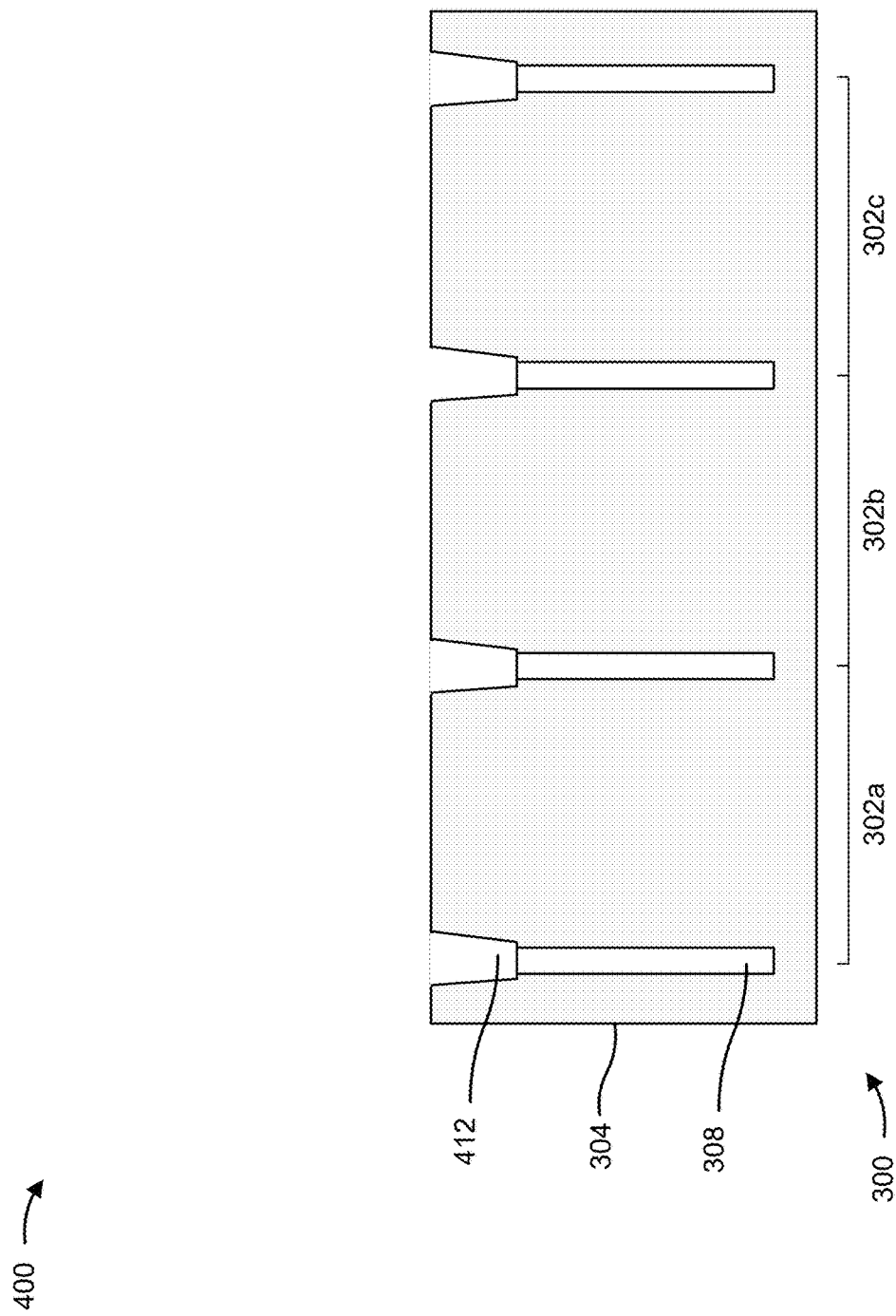
Figure 4H:
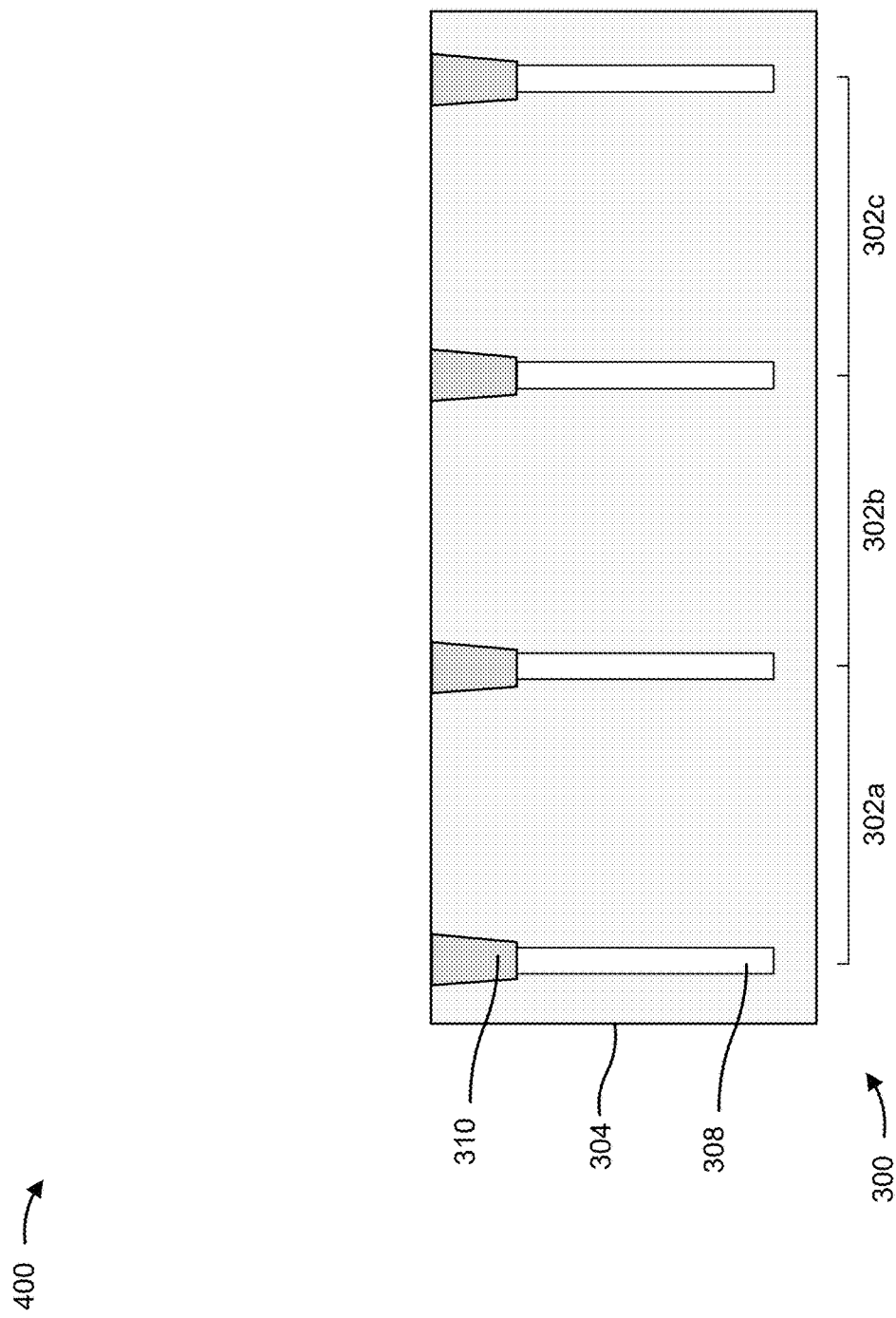
Figure 4I:
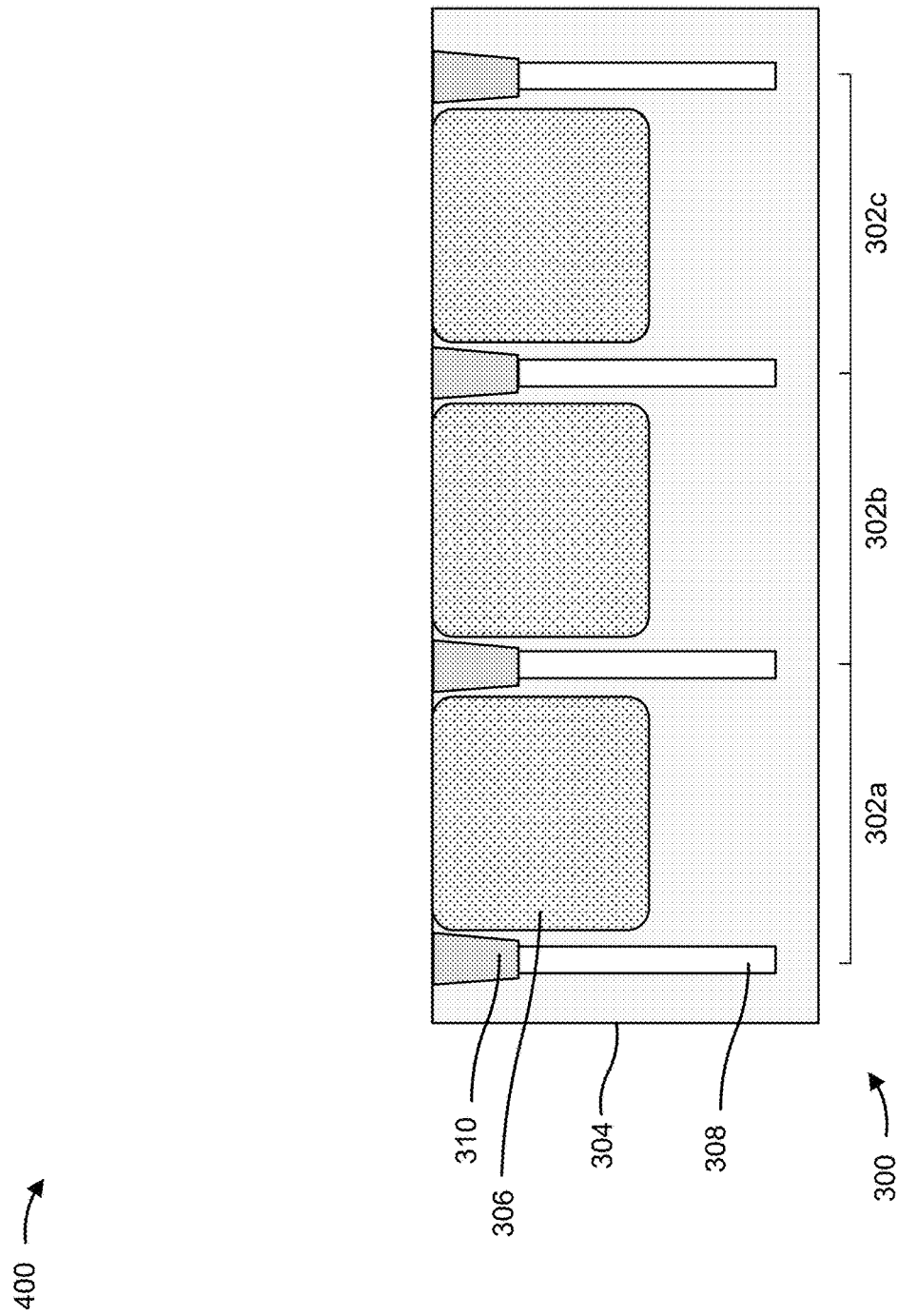
Figure 4J:
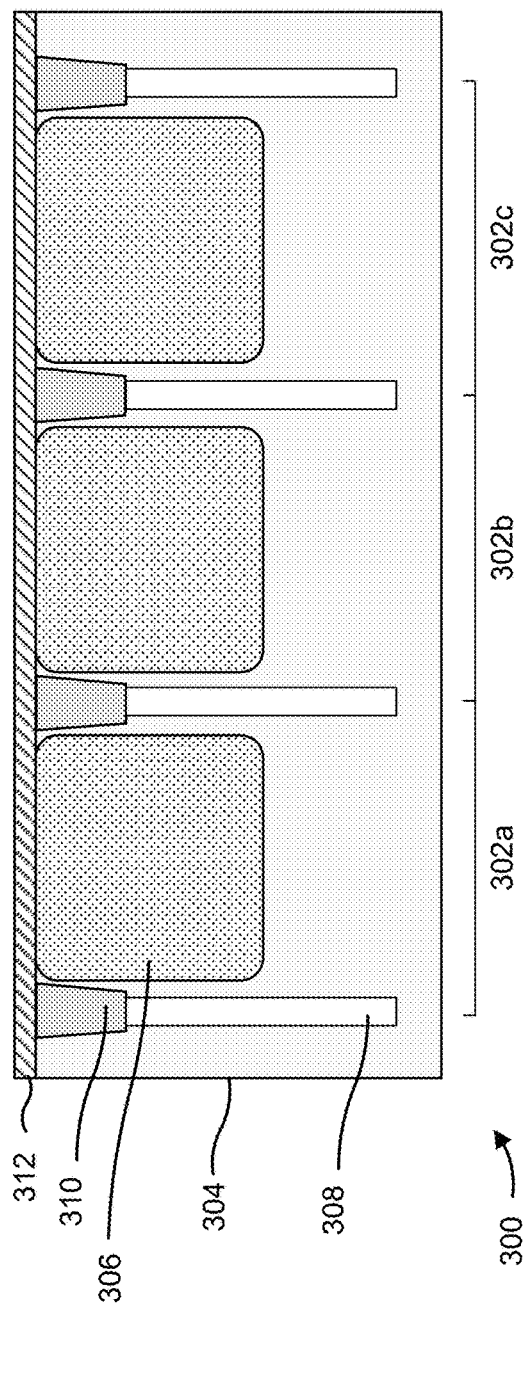
Figure 4K:
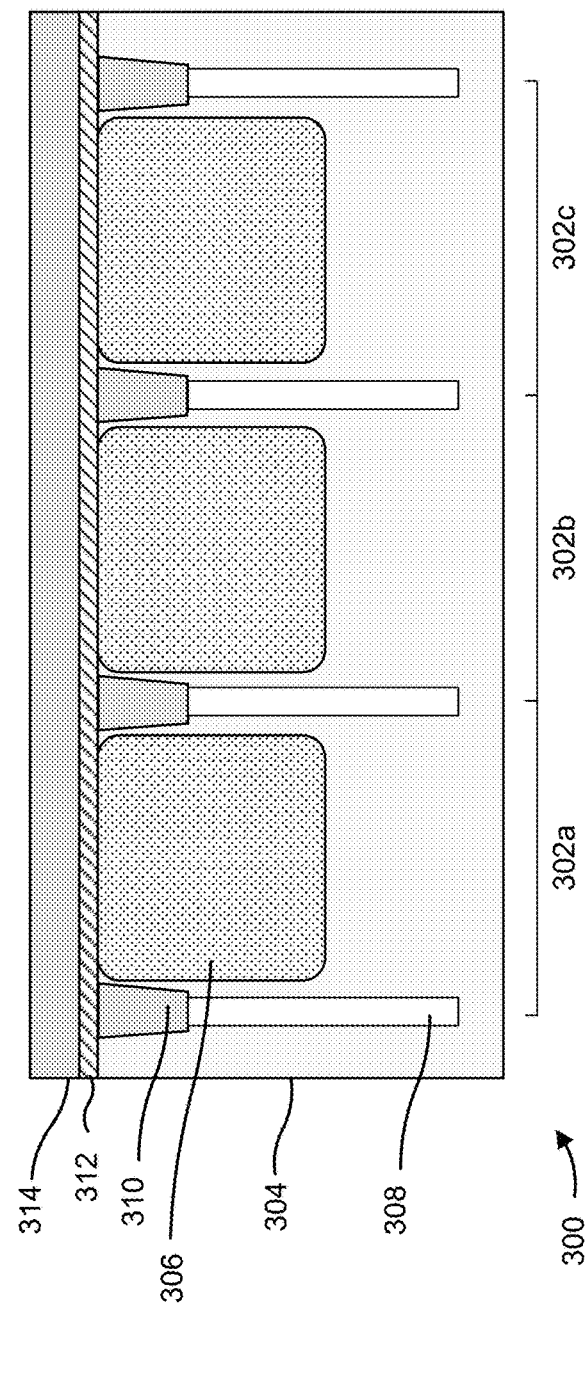
Figure 4L:
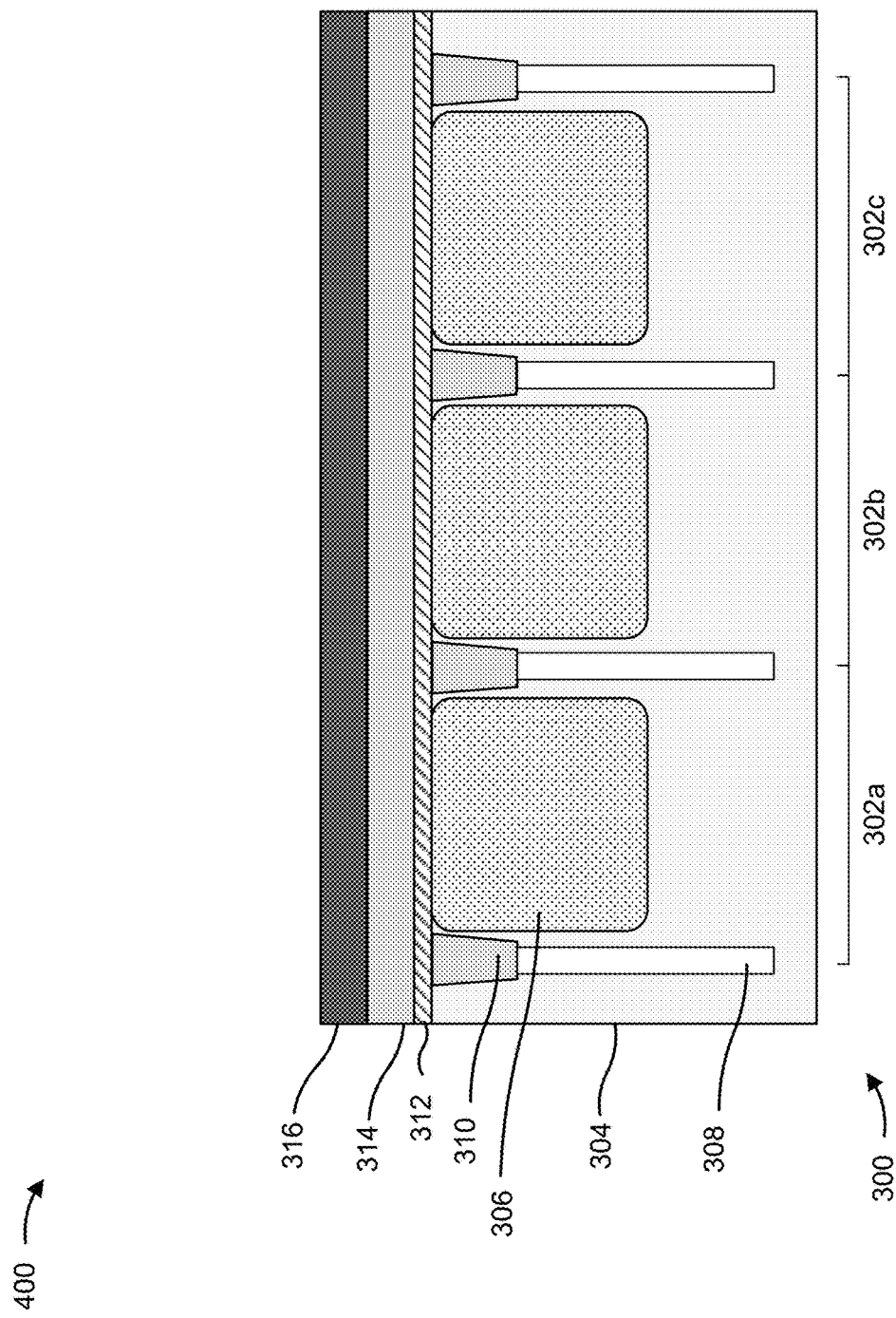
Figure 4M:
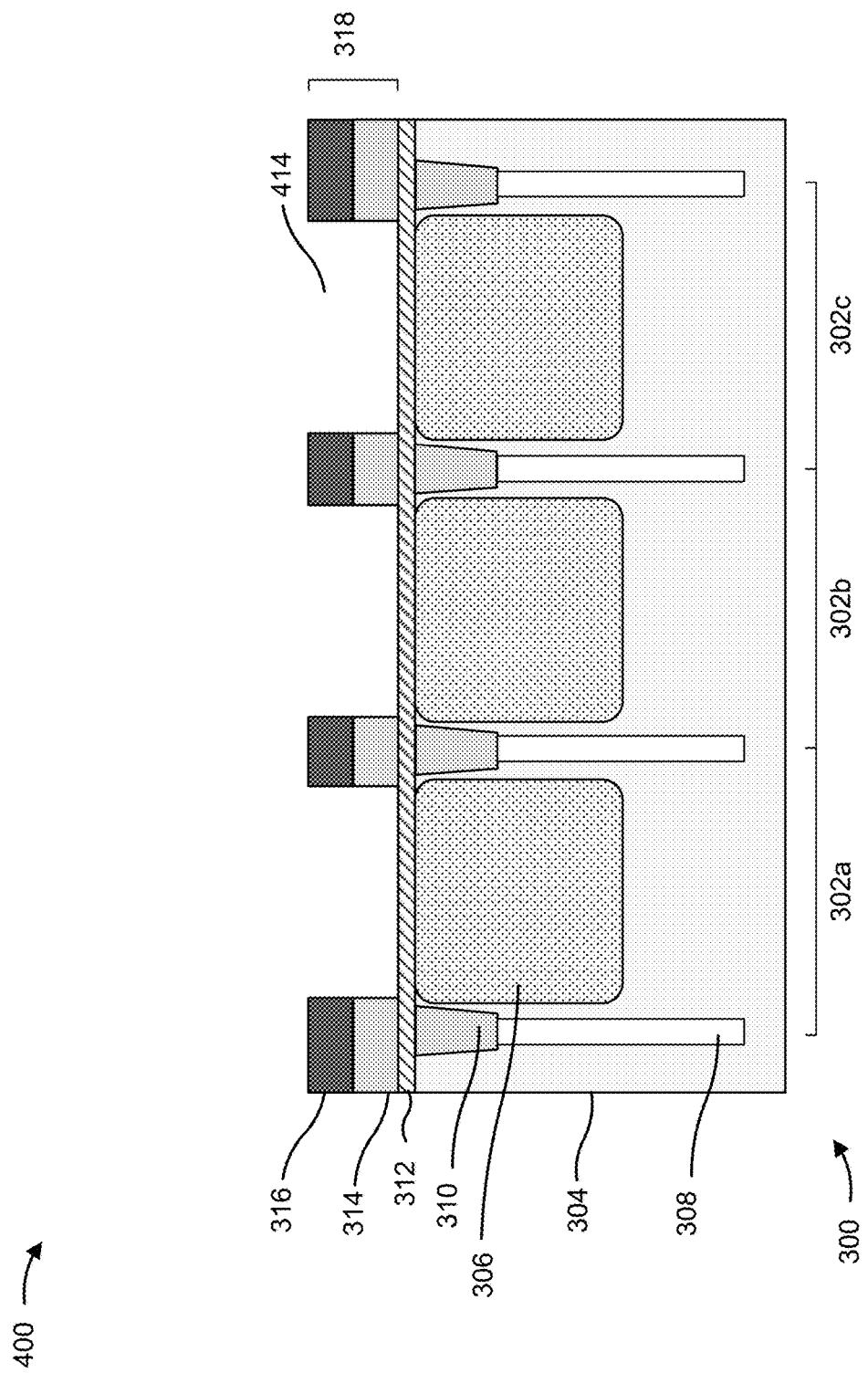
Figure 4N:
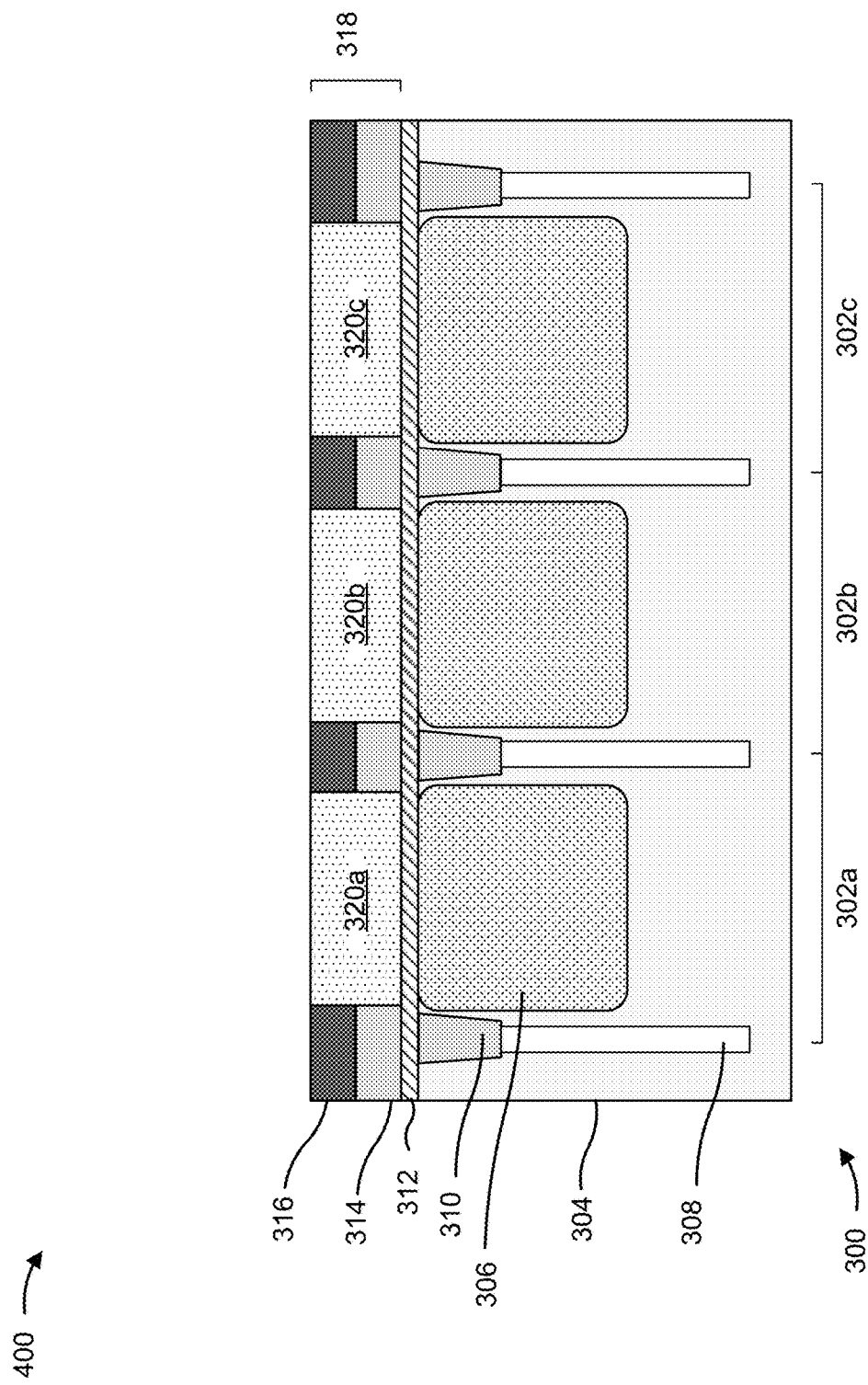
Figure 4O:
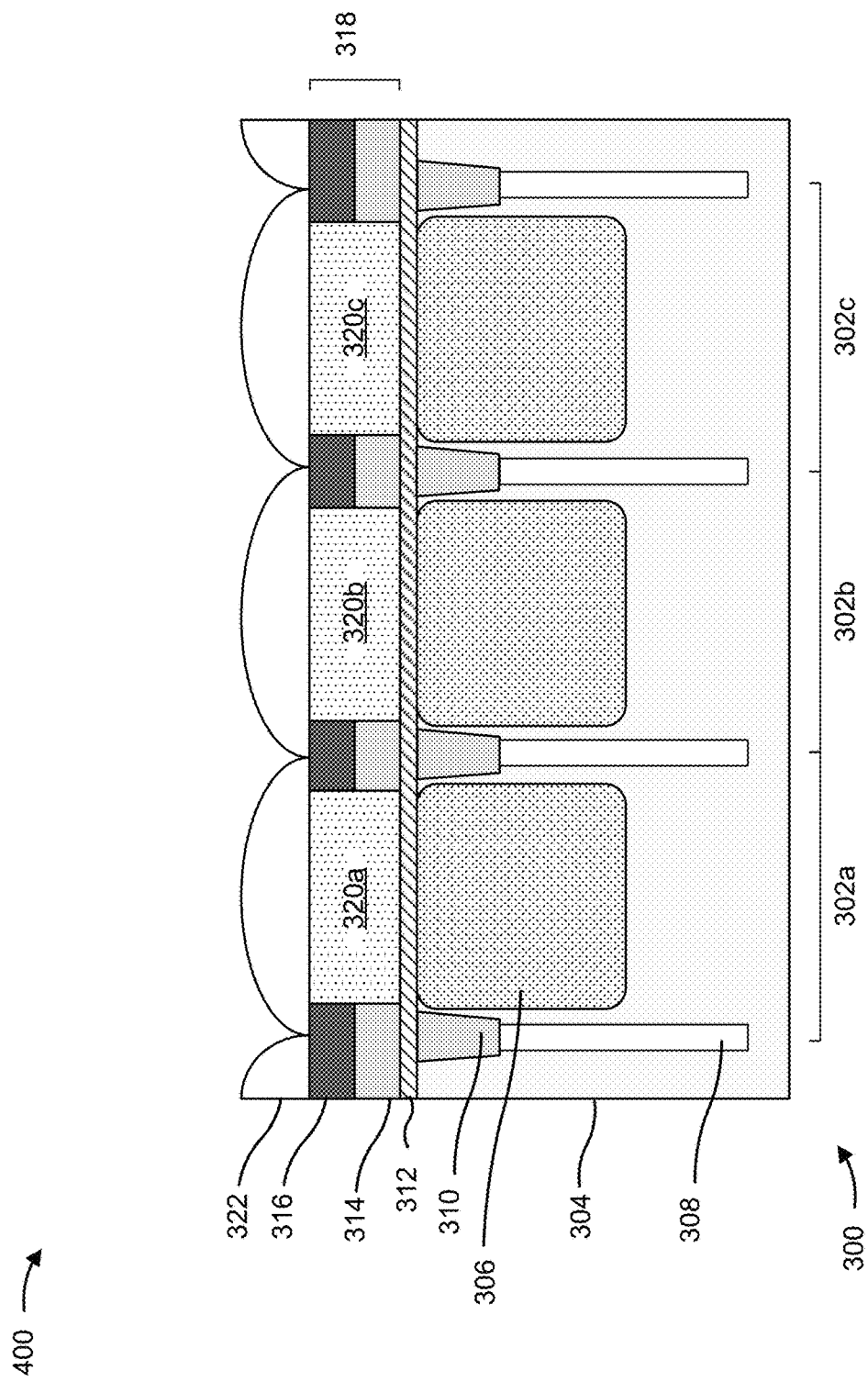

FIGS. 4A-4O are diagrams of an example implementation 400 described herein. The example implementation 400 may be an example process or method for forming the pixel array 300. The example implementation 400 may include an implantation mask formation technique for forming the isolation wells 308 of the pixel array 300. The implantation mask formation technique described in connection with FIGS. 4A-4O may reduce and/or prevent pattern collapses and/or other types of failures of the implantation mask that is used to form the isolation wells 308. Accordingly, the implantation mask formation technique described in connection with FIGS. 4A-4O may permit the pattern of the mask to be formed to increased aspect ratios (e.g., equal to and/or greater than approximately 10), which may enable the formation of ultra-high aspect ratio implantation wells (e.g., of equal to and/or greater than approximately 10) and/or may enable the reduction of pixel sensor sizes (or pixel sensor pitches) to sub-micron sizes.

As shown in FIG. 4A, the pixel sensors 302 (e.g., the pixel sensor 302a, the pixel sensor 302b, the pixel sensor 302c, and so on) may be formed in the substrate 304. The substrate 304 may include a silicon substrate, a substrate formed of a material including silicon, a III-V compound semiconductor substrate such as gallium arsenide (GaAs) substrate, a silicon on insulator (SOI) substrate, or another type of substrate is capable of generating a charge from photons of incident light.

FIG. 4B illustrates a top-down view of the pixel array 300 and a cross-sectional view along the line AA. As shown in FIG. 4B, a photoresist layer 402 may be formed over and/or on the substrate 304. The photoresist layer 402 may include a photoresist material. The deposition tool 102 may deposit the photoresist layer 402 by a spin-coating technique, or another despotion deposition technique, to form the photoresist layer 402.

FIG. 4C illustrates another top-down view of the pixel array 300 and another cross-sectional view along the line AA. As shown in FIG. 4C, a pattern 404 may be formed in the photoresist layer 402 by removing a plurality of portions of the photoresist layer 402. The pattern 404 may be formed by exposing the photoresist layer 402 to a radiation source (e.g., using the exposure tool 104) and removing either the exposed portions or the non-exposed portions of the photoresist layer 402 (e.g., using developer tool 106). In this way, the pattern 404 is formed through the photoresist layer 402 (e.g., from a top surface of the photoresist layer 402 through the photoresist layer 402 to the bottom surface of the photoresist layer 402) to the substrate 304. As further shown in FIG. 4C, the pattern 404 may include grid shape.

The grid may include a plurality of trenches that intersect at various locations in the photoresist layer 402. The deposition tool 102 may form the trenches through the photoresist layer 402 to an initial width (W2) in a range of approximately 200 nanometers to approximately 260 nanometers to reduce and/or minimize the capillary action in the trenches causing a collapse of the pattern 404. However, other values for the initial width (W2) are within the scope of the present disclosure. Moreover, the deposition tool 102 may form the trenches through the photoresist layer 402 to a height (H2) of approximately 1 micron to approximately 2 microns to reduce and/or minimize the likelihood of collapse of the pattern 404. However, other values for the height (H2) are within the scope of the present disclosure.

FIG. 4D illustrates another top-down view of the pixel array 300 and another cross-sectional view along the line AA. As shown in FIG. 4D, a hardening layer 406 may be formed over and/or on the top surfaces of the photoresist layer 402 and on the sidewalls of the trenches of the pattern 404 on the photoresist layer 402. To form the hardening layer 406, a resist hardening operation may be performed on the top surfaces of the photoresist layer 402 and on the sidewalls of the trenches. The resist hardening operation may increase the hardness of the top surfaces of the photoresist layer 402 and the sidewalls of the trenches, which may decrease damage to the top surfaces of the photoresist layer 402 and the sidewalls of the trenches during an ion implantation operation to form the isolation wells 308.

The resist hardening operation may include performing a surface treatment operation on the top surfaces of the photoresist layer 402 and the sidewalls of the trenches using a perfluorinated compound. The perfluorinated compound may include a compound that includes carbon-fluorines and carbon-carbon bonds, such as a fluorinated carbon ($C_xF_y$), a fluorinated hydrocarbon ($C_xHF_y$), and/or another type of perfluorinated compound. The deposition tool 102 may deposit the perfluorinated compound onto the top surfaces of the photoresist layer 402 and the sidewalls of the trenches using a PECVD technique and/or or another CVD technique. The perflourinated compound may contact the top surfaces of the photoresist layer 402 and the sidewalls of the trenches and may react with the material of the photoresist layer 402 and may locally and partially cross-link with the material of the photoresist layer 402 to form the hardening layer 406.

The hardening layer 406 may include a carbon-based crust having a greater carbon density relative to the carbon density of the material of photoresist layer 402 due to the carbon in the perfluorinated compound. The greater carbon density increases the hardness of the top surfaces of the photoresist layer 402 and the sidewalls of the trenches, which may decrease damage to the top surfaces of the photoresist layer 402 and the sidewalls of the trenches during an ion implantation operation to form the isolation wells 308.

As further shown in FIG. 4D, the hardening layer 406 may have a thickness (T1) that is in a range of approximately 10 nanometers to approximately 30 nanometers to decrease the initial width of the trenches of the pattern 404 so as to increase the aspect ratio of the trenches, between a height (H3) and a width (W3), to be equal to or greater than approximately 10. In this way, the increased aspect ratio of the trenches may be used to form the isolation wells 308 to an ultra-high aspect ratio. The hardening layer 406 may decrease the width of the trenches of the pattern 404 to a width (W3) that is in a range of approximately 180 nanometers to approximately 230 nanometers to enable the isolation wells 308 to be formed to an ultra-high aspect ratio. However, other values for the width (W3) are within the scope of the present disclosure. The deposition tool 102 may perform the resist hardening operation (e.g., by depositing the perfluorinated compound) for a duration in a range of approximately 30 seconds to approximately 120 seconds to achieve a thickness (T1) of the hardening layer 406 in the range of approximately 10 nanometers to approximately 30 nanometers. However, other durations are within the scope of the present disclosure. The height (H3) of the trenches may be in a range of approximately 1000 nanometers to approximately 3000 nanometers to achieve an aspect ratio for the trenches of approximately 10 or greater.

As shown in the cross-sectional view in FIG. 4E, the isolation wells 308 may be formed in the substrate 304 based on the implantation mask 408 (e.g., which may include the photoresist layer 402, the hardening layer 406, and the pattern 404). For example, the ion implantation tool 114 may dope a plurality of portions of the substrate 304 by implanting ions 410 (e.g., p-type ions, n-type ions) into the substrate 304 through the trenches in the pattern 404 of the implantation mask 408. The ion implantation tool 114 may generate the ions using a source material such as boron, phosphorous, and/or another type of source material, and may implant the ions using a high-energy implantation process (e.g., at an energy of 500,000 electron-volts (eV) and/or at a different energy level).

The ion implantation tool 114 may form the isolation wells 308 to a high aspect ratio (or an ultra-high aspect ratio) between the height (H1) of the isolation wells 308 and the width (W1) of the of the isolation wells 308 using the implantation mask 408. As an example, ion implantation tool 114 may form the isolation wells 308 to an aspect ratio of approximately 10 or greater to achieve a greater isolation well height (H1) and/or a smaller isolation well width (W1), which may provide increased full well capacity and/or increased isolation performance for the isolation wells 308.

As shown in the cross-sectional view in FIG. 4F, the remaining portions of the photoresist layer 402 and the hardening layer 406 may be removed from the substrate 304. Various techniques may be used to remove the remaining portions of the photoresist layer 402 and the hardening layer 406, such as selective etching, ashing (e.g., plasma ashing), and/or photoresist stripping, among other examples.

As shown in the cross-sectional view in FIG. 4G, a plurality of openings 412 may be formed in the substrate 304 over the isolation wells 308. The deposition tool 102 may form a photoresist layer on the substrate 304, the exposure tool 104 may expose the photoresist layer to a radiation source to pattern the photoresist layer, the developer tool 106 may develop and remove portions of the photoresist layer to expose the pattern, and the etch tool 108 may etch portions of the substrate 304 to form the openings 412. The etch tool 108 may etch the openings 412 down into the substrate 304 (e.g., from the top surface of the substrate 304) to or near the isolation wells 308. In some implementations, a photoresist removal tool removes the remaining portions of the photoresist layer (e.g., using a chemical stripper, a plasma asher, and/or another technique) after the etch tool 108 etches the substrate 304.

As shown in the cross-sectional view in FIG. 4H, the openings 412 may be filled with an oxide material and/or another type of dielectric material to form the isolation structure 310. The deposition tool 102 may deposit the oxide material in the openings 412 using various PVD techniques, CVD techniques and/or ALD techniques, such as sputtering, PECVD, HDP-CVD, SACVD, and/or PEALD, among other examples. In some implementations, the planarization tool 110 planarizes the oxide material after the oxide material is deposited.

As shown in the cross-sectional view in FIG. 4I one or more semiconductor processing tools may form a plurality of photodiodes 306 in the substrate 304. For example, the ion implantation tool 114 may dope the portions of the substrate 304 in between the trenches of the isolation structure 310 and in between the isolation wells 308 using an ion implantation technique to form a respective photodiode 306 for a plurality of pixel sensors 302 (e.g., pixel sensors 302a-302c). The substrate 304 may be doped with a plurality of types of ions to form a p-n junction for each photodiode 306. For example, the substrate 304 may be doped with an n-type dopant to form a first portion (e.g., an n-type portion) of a photodiode 306 and a p-type dopant to form a second portion (e.g., a p-type portion) of the photodiode 306. In some implementations, another technique is used to form the photodiodes 306 such as diffusion.

As shown in the cross-sectional view in FIG. 4J, the ARC 312 may be formed over and/or on the substrate 304, over and/or on the photodiodes 306, and over and/or on the isolation structure 310. The deposition tool 102 may deposit the ARC 312 using a CVD technique, a PVD technique, an ALD technique, or another type of deposition technique described above in connection with FIG. 1. The planarization tool 110 may planarize the ARC 312 after the ARC 312 is deposited.

As shown in the cross-sectional view in FIG. 4K, the dielectric layer 314 may be formed over and/or on the ARC 312. The deposition tool 102 may deposit the dielectric layer 314 using a CVD technique, a PVD technique, an ALD technique, or another type of deposition technique described above in connection with FIG. 1. The planarization tool 110 may planarize the dielectric layer 314 after the dielectric layer 314 is deposited.

As shown in the cross-sectional view in FIG. 4L, the metal layer 316 may be formed over and/or on the dielectric layer 314. The deposition tool 102 may deposit the material of the metal layer 316 using a CVD technique, a PVD technique, an ALD technique, or another type of deposition technique, the plating tool 112 may deposit the material of the metal layer 316 using an electroplating operation, or a combination thereof. The planarization tool 110 may planarize the metal layer 316 after the metal layer 316 is deposited.

As shown in the cross-sectional view in FIG. 4M, portions of the metal layer 316 and portions of the dielectric layer 314 may be removed to form openings 414 through the metal layer 316 and through the dielectric layer 314. The remaining portions of the metal layer 316 and portions of the dielectric layer 314 may form the grid structure 318. The openings 414 may be formed by coating the metal layer 316 with a photoresist (e.g., using the deposition tool 102), forming a pattern in the photoresist by exposing the photoresist to a radiation source (e.g., using the exposure tool 104), removing either the exposed portions or the non-exposed portions of the photoresist (e.g., using developer tool 106), and etching through the metal layer 316 and into a portion of and/or through the dielectric layer 314 (e.g., using the etch tool 108) based on the pattern in the photoresist.

As shown in the cross-sectional view in FIG. 4N, respective color filter regions 320 may be formed for each of the pixel sensors 302 in the pixel array 300 in the openings 414 in between the grid structure 318. For example, the color filter region 320a may be formed in an opening 414 above the photodiode 306 for the pixel sensor 302a, a color filter region 320b may be formed in an opening 414 above the photodiode 306 for the pixel sensor 302b, a color filter region 320c may be formed in an opening 414 above the photodiode 306 for the pixel sensor 302c, and so on. Each color filter region 320 may be formed in between the grid structure 318 to reduce color mixing between adjacent pixel sensors 302. A semiconductor processing tool (e.g., the deposition tool 102) may deposit the color filter regions 320 using various PVD techniques, CVD techniques and/or ALD techniques, such as sputtering, PECVD, HDP-CVD, SACVD, or PEALD.

As shown in the cross-sectional view in FIG. 4O, the micro-lens layer 322 including a plurality of micro-lenses is formed over and/or on the color filter regions 320 and over and/or on the grid structure 318. The micro-lens layer 322 may include a respective micro-lens for each of the pixel sensors 302 included in the pixel array 300. For example, a micro-lens may be formed over and/or on the color filter region 320a of the pixel sensor 302a, a micro-lens may be formed over and/or on the color filter region 320b of the pixel sensor 302b, a micro-lens may be formed over and/or on the color filter region 320c of the pixel sensor 302c, and so on.

As indicated above, FIGS. 4A-4O are provided as an example. Other examples may differ from what is described with regard to FIGS. 4A-4O.

Figure 5:
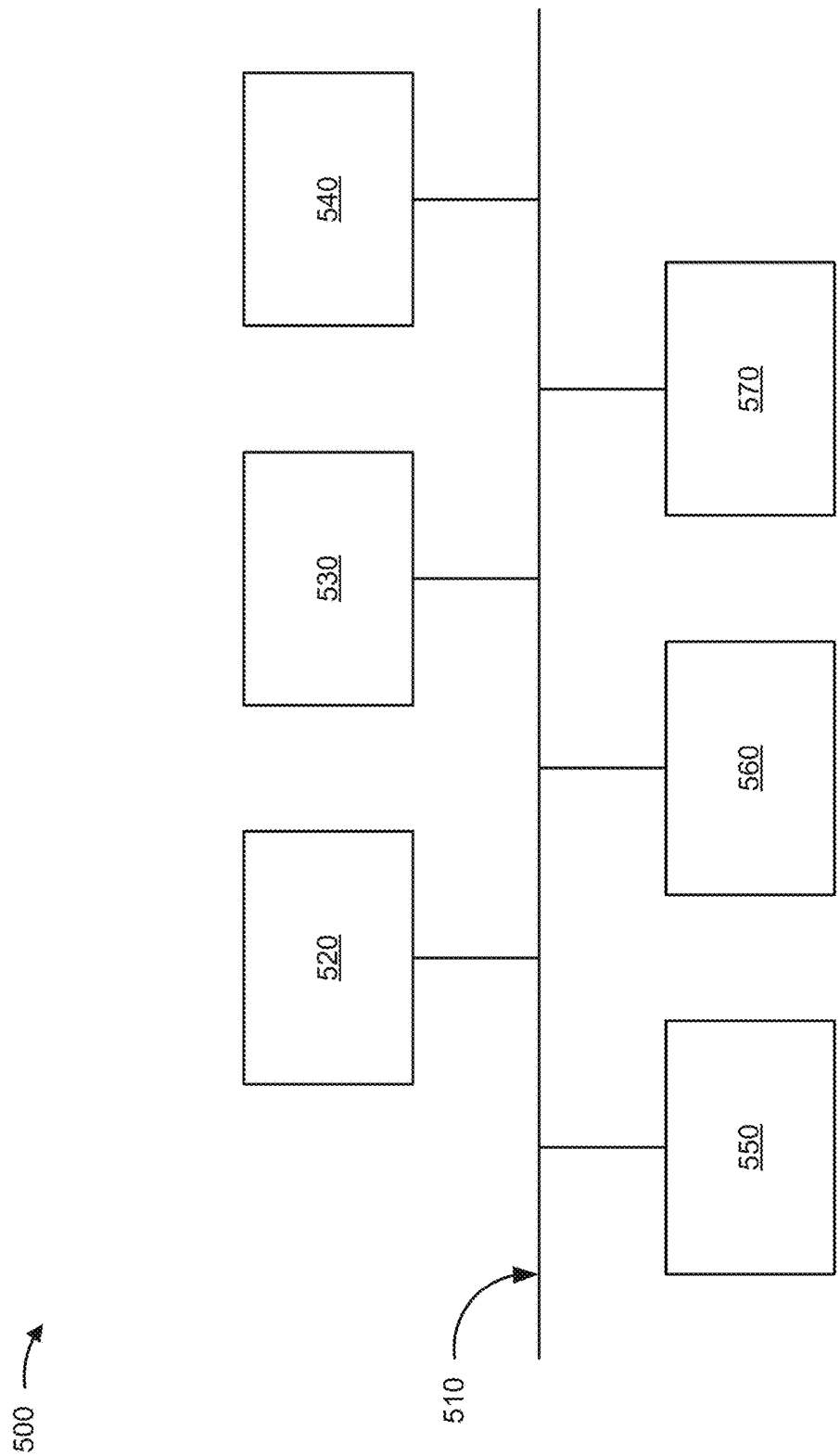
FIG. 5 is a diagram of example components of one or more devices of FIG. 1.

FIG. 5 is a diagram of example components of a device 500. In some implementations, one or more of the semiconductor processing tools 102-114 and/or the wafer/die transport tool 116 may include one or more devices 500 and/or one or more components of device 500. As shown in FIG. 5, device 500 may include a bus 510, a processor 520, a memory 530, a storage component 540, an input component 550, an output component 560, and a communication component 570.

Bus 510 includes a component that enables wired and/or wireless communication among the components of device 500. Processor 520 includes a central processing unit, a graphics processing unit, a microprocessor, a controller, a microcontroller, a digital signal processor, a field-programmable gate array, an application-specific integrated circuit, and/or another type of processing component. Processor 520 is implemented in hardware, firmware, or a combination of hardware and software. In some implementations, processor 520 includes one or more processors capable of being programmed to perform a function. Memory 530 includes a random access memory, a read only memory, and/or another type of memory (e.g., a flash memory, a magnetic memory, and/or an optical memory).

Storage component 540 stores information and/or software related to the operation of device 500. For example, storage component 540 may include a hard disk drive, a magnetic disk drive, an optical disk drive, a solid state disk drive, a compact disc, a digital versatile disc, and/or another type of non-transitory computer-readable medium. Input component 550 enables device 500 to receive input, such as user input and/or sensed inputs. For example, input component 550 may include a touch screen, a keyboard, a keypad, a mouse, a button, a microphone, a switch, a sensor, a global positioning system component, an accelerometer, a gyroscope, and/or an actuator. Output component 560 enables device 500 to provide output, such as via a display, a speaker, and/or one or more light-emitting diodes. Communication component 570 enables device 500 to communicate with other devices, such as via a wired connection and/or a wireless connection. For example, communication component 570 may include a receiver, a transmitter, a transceiver, a modem, a network interface card, and/or an antenna.

Device 500 may perform one or more processes described herein. For example, a non-transitory computer-readable medium (e.g., memory 530 and/or storage component 540) may store a set of instructions (e.g., one or more instructions, code, software code, and/or program code) for execution by processor 520. Processor 520 may execute the set of instructions to perform one or more processes described herein. In some implementations, execution of the set of instructions, by one or more processors 520, causes the one or more processors 520 and/or the device 500 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 5 are provided as an example. Device 500 may include additional components, fewer components, different components, or differently arranged components than those shown in FIG. 5. Additionally, or alternatively, a set of components (e.g., one or more components) of device 500 may perform one or more functions described as being performed by another set of components of device 500.

Figure 6:
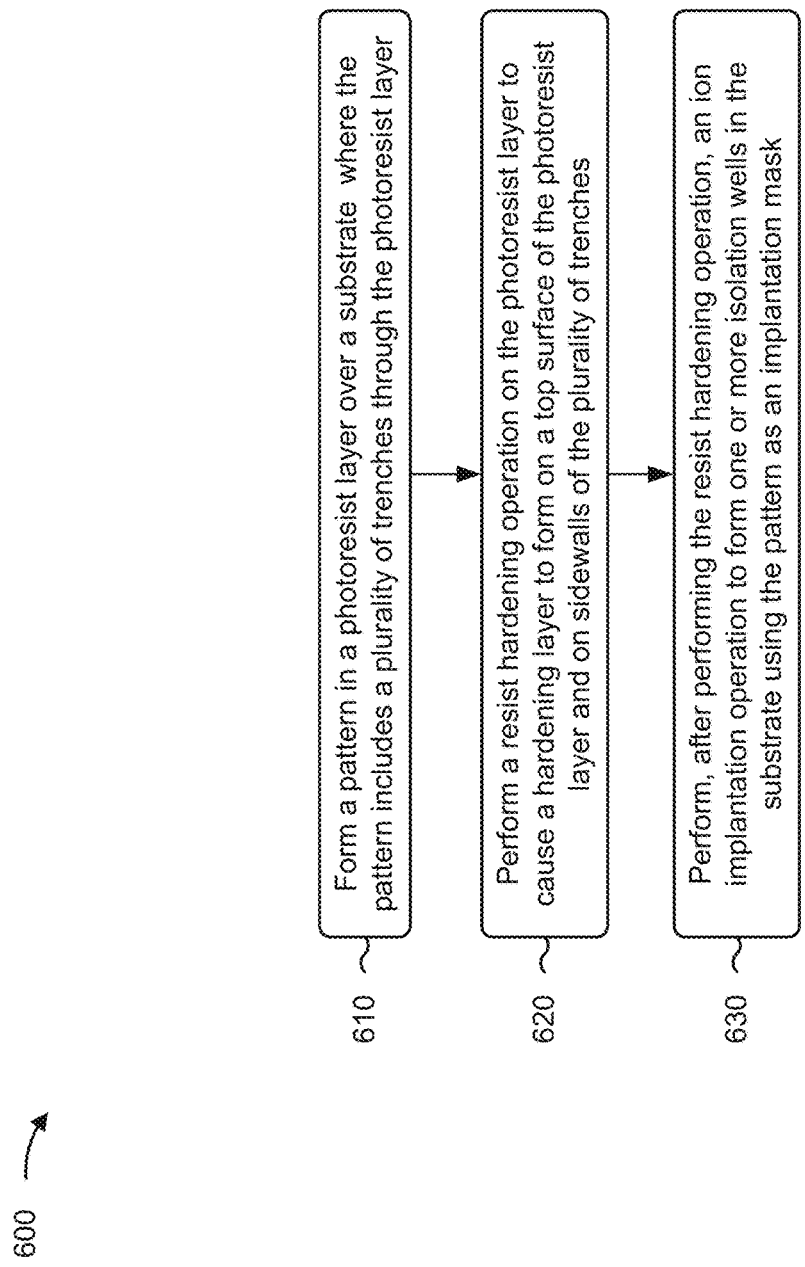
FIGS. 6-8 are flowcharts of example processes relating to forming isolation wells.

FIG. 6 is a flowchart of an example process 600 associated with forming isolation wells. In some implementations, one or more process blocks of FIG. 6 may be performed by one or more semiconductor processing tools (e.g., one or more of the semiconductor processing tools 102-114). Additionally, or alternatively, one or more process blocks of FIG. 6 may be performed by one or more components of device 500, such as processor 520, memory 530, storage component 540, input component 550, output component 560, and/or communication component 570.

As shown in FIG. 6, process 600 may include forming a pattern in a photoresist layer over a substrate, where the pattern includes a plurality of trenches through the photoresist layer (block 610). For example, one or more of the semiconductor processing tools 102-114 may form the pattern 404 in the photoresist layer 402 over the substrate 304, as described above. In some implementations, the pattern 404 includes a plurality of trenches through the photoresist layer 402.

As further shown in FIG. 6, process 600 may include performing a resist hardening operation on the photoresist layer to cause a hardening layer to form on a top surface of the photoresist layer and on sidewalls of the plurality of trenches (block 620). For example, one or more of the semiconductor processing tools 102-114 may perform a resist hardening operation on the photoresist layer 402 to cause the hardening layer 406 to form on a top surface of the photoresist layer 402 and on sidewalls of the plurality of trenches, as described above.

As further shown in FIG. 6, process 600 may include performing, after performing the resist hardening operation, an ion implantation operation to form one or more isolation wells in the substrate using the pattern as an implantation mask (block 630). For example, one or more of the semiconductor processing tools 102-114 may perform, after performing the resist hardening operation, an ion implantation operation to form one or more isolation wells (e.g., isolation wells 204 and/or 308) in the substrate 304 using the pattern 404 as the implantation mask 408, as described above.

Process 600 may include additional implementations, such as any single implementation or any combination of implementations described below and/or in connection with one or more other processes described elsewhere herein.

In a first implementation, the one or more isolation wells are included in a pixel array (e.g., the 200 and/or 300), and the one or more isolation wells provide optical isolation between adjacent pixel sensors (e.g., the pixel sensors 202 and/or 302) in the pixel array. In a second implementation, alone or in combination with the first implementation, a carbon density of the hardening layer 406 is greater relative to a carbon density of the photoresist layer 402. In a third implementation, alone or in combination with one or more of the first and second implementations, forming the pattern 404 in the photoresist layer 402 includes forming the pattern 404 such that an aspect ratio between a height (H2) of the plurality of trenches and a width (W2) of the plurality of trenches is equal to or less than approximately 8. In a fourth implementation, alone or in combination with one or more of the first through third implementations, formation of the hardening layer 406 increases the aspect ratio to equal to or greater than approximately 10.

In a fifth implementation, alone or in combination with one or more of the first through fourth implementations, a width (W3) of a trench, of the plurality of trenches, is in a range of approximately 180 nanometers to approximately 230 nanometers after formation of the hardening layer 406. In a sixth implementation, alone or in combination with one or more of the first through fifth implementations, the width (W2) of the trench is in a range of approximately 230 nanometers to approximately 260 nanometers prior to formation of the hardening layer 406. In a seventh implementation, alone or in combination with one or more of the first through sixth implementations, performing the resist hardening operation includes performing the resist hardening operation for a duration of approximately 30 seconds to approximately 120 seconds.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

Figure 7:
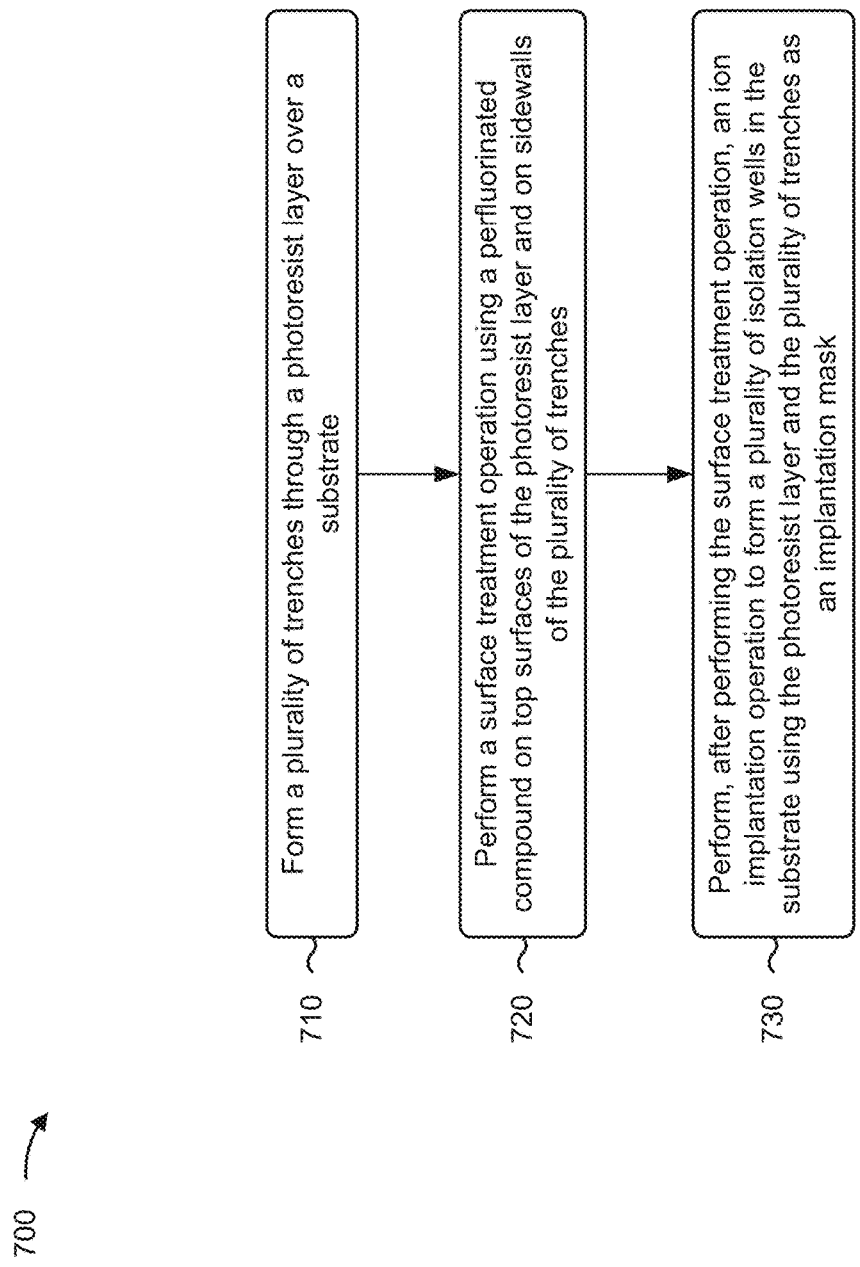

FIG. 7 is a flowchart of an example process 700 associated with isolation well formation. In some implementations, one or more process blocks of FIG. 7 may be performed by one or more semiconductor processing tools (e.g., one or more of the semiconductor processing tools 102-114). Additionally, or alternatively, one or more process blocks of FIG. 7 may be performed by one or more components of device 500, such as processor 520, memory 530, storage component 540, input component 550, output component 560, and/or communication component 570.

As shown in FIG. 7, process 700 may include forming a plurality of trenches through a photoresist layer over a substrate (block 710). For example, one or more of the semiconductor processing tools 102-114 may form a plurality of trenches through the photoresist layer 402 over the substrate 304, as described above.

As further shown in FIG. 7, process 700 may include performing a surface treatment operation using a perfluorinated compound on top surfaces of the photoresist layer and on sidewalls of the plurality of trenches (block 720). For example, one or more of the semiconductor processing tools 102-114 may perform a surface treatment operation using a perfluorinated compound on top surfaces of the photoresist layer 402 and on sidewalls of the plurality of trenches, as described above. In some implementations, the perfluorinated compound reacts with the photoresist layer 402 to form a hardening layer 406 on the top surfaces of the photoresist layer 402 and on the sidewalls of the plurality of trenches. In some implementations, a carbon density of the hardening layer 406 is greater relative to a carbon density of the photoresist layer 402.

As further shown in FIG. 7, process 700 may include performing, after performing the surface treatment operation, an ion implantation operation to form a plurality of isolation wells in the substrate using the photoresist layer and the plurality of trenches as an implantation mask (block 730). For example, the one or more of the semiconductor processing tools 102-114 may perform, after performing the surface treatment operation, an ion implantation operation to form a plurality of isolation wells (e.g., the isolation wells 204 and/or 308) in the substrate 304 using the photoresist layer 402 and the plurality of trenches as the implantation mask 408, as described above.

Process 700 may include additional implementations, such as any single implementation or any combination of implementations described below and/or in connection with one or more other processes described elsewhere herein.

In a first implementation, the perfluorinated compound includes at least one of a fluorinated carbon ($C_xF_y$) or a fluorinated hydrocarbon ($C_xHF_y$). In a second implementation, alone or in combination with the first implementation, performing the surface treatment operation using the perfluorinated compound includes depositing the perfluorinated compound onto the top surfaces of the photoresist layer 402 and on the sidewalls of the plurality of trenches by a PECVD operation. In a third implementation, alone or in combination with one or more of the first and second implementations, the plurality of isolation wells surround a plurality of pixel sensors (e.g., the pixel sensors 202 and/or 302) included in a pixel array (e.g., the pixel array 200 and/or 300).

In a fourth implementation, alone or in combination with one or more of the first through third implementations, the perfluorinated compound locally and partially cross-links with the photoresist layer 402 to form the hardening layer 406. In a fifth implementation, alone or in combination with one or more of the first through fourth implementations, a thickness of the hardening layer 406 is in a range of approximately 10 nanometers to approximately 30 nanometers. In a sixth implementation, alone or in combination with one or more of the first through fifth implementations, formation of the hardening layer 406 increases an aspect ratio, between a height (H3) of the plurality of trenches and a width (W3) of the plurality of trenches, to equal to or greater than approximately 10.

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

Figure 8:
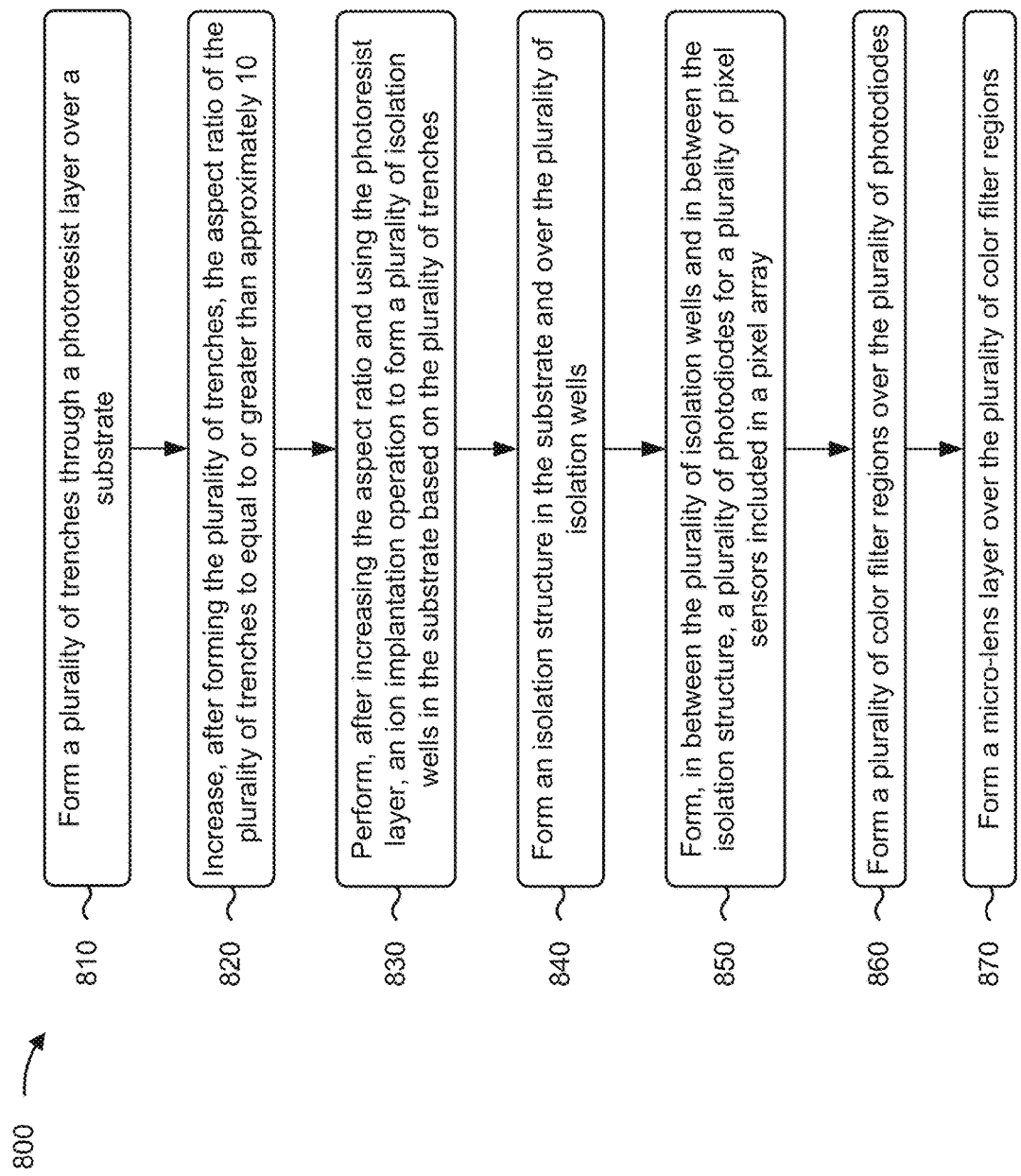

FIG. 8 is a flowchart of an example process 800 associated with isolation well formation. In some implementations, one or more process blocks of FIG. 8 may be performed by one or more of semiconductor processing tools (e.g., one or more of the semiconductor processing tools 102-114). Additionally, or alternatively, one or more process blocks of FIG. 8 may be performed by one or more components of device 500, such as processor 520, memory 530, storage component 540, input component 550, output component 560, and/or communication component 570.

As shown in FIG. 8, process 800 may include forming a plurality of trenches through a photoresist layer over a substrate (block 810). For example, one or more of the semiconductor processing tools 102-114 may form a plurality of trenches through the photoresist layer 402 over the substrate 304, as described above. In some implementations, an aspect ratio, between a height (H2) of the plurality of trenches and a width (W2) of the plurality of trenches, is equal to or less than approximately 8.

As further shown in FIG. 8, process 800 may include increasing, after forming the plurality of trenches, the aspect ratio of the plurality of trenches to equal to or greater than approximately 10 (block 820). For example, one or more of the semiconductor processing tools 102-114 may increase, after forming the plurality of trenches, the aspect ratio of the plurality of trenches to equal to or greater than approximately 10, as described above.

As further shown in FIG. 8, process 800 may include performing, after increasing the aspect ratio and using the photoresist layer, an ion implantation operation to form a plurality of isolation wells in the substrate based on the plurality of trenches (block 830). For example, one or more of the semiconductor processing tools 102-114 may perform, after increasing the aspect ratio and using the photoresist layer 402, an ion implantation operation to form a plurality of isolation wells (e.g., the isolation wells 204 and/or 308) in the substrate 304 based on the plurality of trenches, as described above.

As further shown in FIG. 8, process 800 may include forming an isolation structure in the substrate and over the plurality of isolation wells (block 840). For example, one or more of the semiconductor processing tools 102-114 may form the isolation structure 310 in the substrate 304 and over the plurality of isolation wells, as described above.

As further shown in FIG. 8, process 800 may include forming, in between the plurality of isolation wells and in between the isolation structure, a plurality of photodiodes for a plurality of pixel sensors included in a pixel array (block 850). For example, one or more of the semiconductor processing tools 102-114 may form, in between the plurality of isolation wells and in between the isolation structure 310, the plurality of photodiodes 306 for a plurality of pixel sensors (e.g., the pixel sensors 202 and/or 302) included in a pixel array (e.g., the pixel array 200 and/or 300), as described above.

As further shown in FIG. 8, process 800 may include forming a plurality of color filter regions over the plurality of photodiodes (block 860). For example, one or more of the semiconductor processing tools 102-114 may form the plurality of color filter regions 320 over the plurality of photodiodes 306, as described above.

As further shown in FIG. 8, process 800 may include forming a micro-lens layer over the plurality of color filter regions (block 870). For example, one or more of the semiconductor processing tools 102-114 may form the micro-lens layer 322 over the plurality of color filter regions 320, as described above.

Process 800 may include additional implementations, such as any single implementation or any combination of implementations described below and/or in connection with one or more other processes described elsewhere herein.

In a first implementation, increasing the aspect ratio of the plurality of trenches includes forming a carbon-based crust (e.g., the hardening layer 406) on sidewalls of the plurality of trenches. In a second implementation, alone or in combination with the first implementation, the carbon-based crust protects the sidewalls during the ion implantation operation. In a third implementation, alone or in combination with one or more of the first and second implementations, forming the carbon-based crust includes depositing a perfluorinated compound on the sidewalls of the plurality of trenches, where the perfluorinated compound cross-links with the photoresist layer 402 to form the carbon-based crust. In a fourth implementation, alone or in combination with one or more of the first through third implementations, a thickness (T1) of the carbon-based crust is in a range of approximately 10 nanometers to approximately 30 nanometers.

Although FIG. 8 shows example blocks of process 800, in some implementations, process 800 may include additional blocks, fewer blocks, different blocks, or differently arranged blocks than those depicted in FIG. 8. Additionally, or alternatively, two or more of the blocks of process 800 may be performed in parallel.

In this way, implantation mask formation techniques described herein include increasing an initial aspect ratio of a pattern in an implantation mask by a non-lithography technique, which may include forming a resist hardening layer on the implantation mask. The pattern may be formed by photolithography techniques to the initial aspect ratio that reduces or minimizes the likelihood of pattern collapse during formation of the pattern. Then, the resist hardening layer is formed on the implantation mask to increase the height of the pattern and reduce the width of the pattern, which increases the aspect ratio between the height of the openings or trenches and the width of the openings or trenches of the pattern. In this way, the pattern in the implantation mask may be formed to an ultra-high aspect ratio in a manner that reduces or minimizes the likelihood of pattern collapse during formation of the pattern.

As described in greater detail above, some implementations described herein provide a method. The method includes forming a pattern in a photoresist layer over a substrate, where the pattern includes a plurality of trenches through the photoresist layer. The method includes performing a resist hardening operation on the photoresist layer to cause a hardening layer to form on a top surface of the photoresist layer and on sidewalls of the plurality of trenches. The method includes performing, after performing the resist hardening operation, an ion implantation operation to form one or more isolation wells in the substrate using the pattern as an implantation mask.

As described in greater detail above, some implementations described herein provide a method. The method includes forming a plurality of trenches through a photoresist layer over a substrate. The method includes performing a surface treatment operation using a perfluorinated compound on top surfaces of the photoresist layer and on sidewalls of the plurality of trenches, where the perfluorinated compound reacts with the photoresist layer to form a hardening layer on the top surfaces of the photoresist layer and on the sidewalls of the plurality of trenches, and where a carbon density of the hardening layer is greater relative to a carbon density of the photoresist layer. The method includes performing, after performing the surface treatment operation, an ion implantation operation to form a plurality of isolation wells in the substrate using the photoresist layer and the plurality of trenches as an implantation mask.

As described in greater detail above, some implementations described herein provide a method. The method includes forming a plurality of trenches through a photoresist layer over a substrate, where an aspect ratio, between a height of the plurality of trenches and a width of the plurality of trenches, is equal to or less than approximately 8. The method includes increasing, after forming the plurality of trenches, the aspect ratio of the plurality of trenches to equal to or greater than approximately 10. The method includes performing, after increasing the aspect ratio and using the photoresist layer, an ion implantation operation to form a plurality of isolation wells in the substrate based on the plurality of trenches. The method includes forming an isolation structure in the substrate and over the plurality of isolation wells. The method includes forming, in between the plurality of isolation wells and in between the isolation structure, a plurality of photodiodes for a plurality of pixel sensors included in a pixel array. The method includes forming a plurality of color filter regions over the plurality of photodiodes. The method includes forming a micro-lens layer over the plurality of color filter regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a pattern in a photoresist layer over a substrate, wherein the pattern includes a plurality of trenches through the photoresist layer;
    performing a resist hardening operation on the photoresist layer to cause a hardening layer to form on a top surface of the photoresist layer and on sidewalls of the plurality of trenches; and
    performing, after performing the resist hardening operation, an ion implantation operation to form one or more isolation wells in the substrate using the pattern as an implantation mask.

2. The method of claim 1, wherein the one or more isolation wells are included in a pixel array; and
    wherein the one or more isolation wells provide optical isolation between adjacent pixel sensors in the pixel array.

3. The method of claim 1, wherein a carbon density of the hardening layer is greater relative to a carbon density of the photoresist layer.

4. The method of claim 1, wherein forming the pattern in the photoresist layer comprises:
    forming the pattern such that an aspect ratio between a height of the plurality of trenches and a width of the plurality of trenches is equal to or less than approximately 8.

5. The method of claim 4, wherein formation of the hardening layer increases the aspect ratio to equal to or greater than approximately 10.

6. The method of claim 1, wherein a width of a trench, of the plurality of trenches, is in a range of approximately 180 nanometers to approximately 230 nanometers after formation of the hardening layer.

7. The method of claim 6, wherein the width of the trench is in a range of approximately 230 nanometers to approximately 260 nanometers prior to formation of the hardening layer.

8. The method of claim 1, wherein performing the resist hardening operation comprises:
    performing the resist hardening operation for a duration in a range of approximately 30 seconds to approximately 120 seconds.

9. A method, comprising:
    forming a plurality of trenches through a photoresist layer over a substrate,
    performing a surface treatment operation using a perfluorinated compound on top surfaces of the photoresist layer and on sidewalls of the plurality of trenches,
        wherein the perfluorinated compound reacts with the photoresist layer to form a hardening layer on the top surfaces of the photoresist layer and on the sidewalls of the plurality of trenches, and
        wherein a carbon density of the hardening layer is greater relative to a carbon density of the photoresist layer; and
    performing, after performing the surface treatment operation, an ion implantation operation to form a plurality of isolation wells in the substrate using the photoresist layer and the plurality of trenches as an implantation mask.

10. The method of claim 9, wherein the perfluorinated compound comprises at least one of:
    a fluorinated carbon ($C_xF_y$), or
    a fluorinated hydrocarbon ($C_xHF_y$).

11. The method of claim 9, wherein performing the surface treatment operation using the perfluorinated compound comprises:
    depositing the perfluorinated compound onto the top surfaces of the photoresist layer and on the sidewalls of the plurality of trenches by a plasma enhanced chemical vapor deposition (PECVD) operation.

12. The method of claim 9, wherein the plurality of isolation wells surround a plurality of pixel sensors included in a pixel array.

13. The method of claim 9, wherein the perfluorinated compound locally and partially cross-links with the photoresist layer to form the hardening layer.

14. The method of claim 9, wherein a thickness of the hardening layer is in a range of approximately 10 nanometers to approximately 30 nanometers.

15. The method of claim 9, wherein formation of the hardening layer increases an aspect ratio, between a height of the plurality of trenches and a width of the plurality of trenches, to equal to or greater than approximately 10.

16. A method, comprising:
forming a plurality of trenches through a photoresist layer over a substrate,
  wherein an aspect ratio, between a height of the plurality of trenches and a width of the plurality of trenches, is equal to or less than approximately 8;
increasing, after forming the plurality of trenches, the aspect ratio of the plurality of trenches to equal to or greater than approximately 10;
performing, after increasing the aspect ratio and using the photoresist layer, an ion implantation operation to form a plurality of isolation wells in the substrate based on the plurality of trenches;
forming an isolation structure in the substrate and over the plurality of isolation wells;
forming, in between the plurality of isolation wells and in between the isolation structure, a plurality of photodiodes for a plurality of pixel sensors included in a pixel array;
forming a plurality of color filter regions over the plurality of photodiodes; and
forming a micro-lens layer over the plurality of color filter regions.

17. The method of claim 16, wherein increasing the aspect ratio of the plurality of trenches comprises:
forming a carbon-based crust on sidewalls of the plurality of trenches.

18. The method of claim 17, wherein the carbon-based crust protects the sidewalls during the ion implantation operation.

19. The method of claim 17, wherein forming the carbon-based crust comprises:
depositing a perfluorinated compound on the sidewalls of the plurality of trenches,
  wherein the perfluorinated compound cross-links with the photoresist layer to form the carbon-based crust.

20. The method of claim 17, wherein a thickness of the carbon-based crust is in a range of approximately 10 nanometers to approximately 30 nanometers.

* * * * *